US012701717B2

(12) United States Patent
Lee et al.

(10) Patent No.: US 12,701,717 B2
(45) Date of Patent: Aug. 4, 2026

(54) SEMICONDUCTOR MEMORY DEVICE

(71) Applicant: Samsung Electronics Co., Ltd., Suwon-si (KR)

(72) Inventors: Yongjae Lee, Seongnam-si (KR); Kyungsoo Kim, Hwaseong-si (KR); Jinyoung Park, Suwon-si (KR); Kyen-Hee Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 758 days.

(21) Appl. No.: 17/934,317

(22) Filed: Sep. 22, 2022

(65) Prior Publication Data

US 2023/0165016 A1 May 25, 2023

(30) Foreign Application Priority Data

Nov. 19, 2021 (KR) ........................ 10-2021-0160628

(51) Int. Cl.
H10B 61/00 (2023.01)
H10N 52/00 (2023.01)
H10N 52/80 (2023.01)
(52) U.S. Cl.
CPC ............. H10B 61/22 (2023.02); H10N 52/00 (2023.02); H10N 52/80 (2023.02)
(58) Field of Classification Search
CPC .......... H10N 52/00; H10N 52/80; H10N 5/80; H10B 61/22; G11C 11/18
See application file for complete search history.

(56) References Cited

U.S. PATENT DOCUMENTS

| | | | |
|---|---|---|---|
| 9,542,987 | B2 | 1/2017 | Naik et al. |
| 9,875,782 | B2 | 1/2018 | Jo et al. |
| 10,103,199 | B2 | 10/2018 | Daibou et al. |
| 10,361,358 | B2 | 7/2019 | Abe et al. |

(Continued)

FOREIGN PATENT DOCUMENTS

| | | |
|---|---|---|
| CN | 110875425 A | 3/2020 |
| CN | 113299822 A | 8/2021 |

(Continued)

OTHER PUBLICATIONS

Ali, Karim, et al., "Area Efficient Multi-Bit per Cell Architecture for SOT-MRAM with Dedicated Diodes for High Density MRAM", IEEE Magnetics Letters, vol. 9, Apr. 20, 2018, 5 pp.

(Continued)

*Primary Examiner* — Latanya N Crawford Eason
(74) *Attorney, Agent, or Firm* — Wolf, Greenfield & Sacks, P.C.

(57) ABSTRACT

A semiconductor memory device is disclosed. The semiconductor memory device may include a magnetic tunnel junction pattern, a spin-orbit torque (SOT) pattern in contact with a first portion of the magnetic tunnel junction pattern, a first transistor electrically connected to a second portion of the magnetic tunnel junction pattern and configured to be controlled by a first word line, and a second transistor electrically connected to a first end of the spin-orbit torque pattern and configured to be controlled by a second word line. An effective channel width of the first transistor may be different from an effective channel width of the second transistor.

20 Claims, 18 Drawing Sheets

(56) References Cited

U.S. PATENT DOCUMENTS

| | | | |
|---|---|---|---|
| 10,748,592 B2 | 8/2020 | Alhalabi et al. | |
| 10,854,261 B1 | 12/2020 | Ghosh | |
| 10,892,011 B2 | 1/2021 | Lin et al. | |
| 10,923,648 B2 | 2/2021 | Ahmed et al. | |
| 10,985,154 B2 | 4/2021 | Lee et al. | |
| 11,514,963 B2 | 11/2022 | Drouard et al. | |
| 11,594,575 B2 | 2/2023 | Lin et al. | |
| 2010/0046283 A1* | 2/2010 | Sakimura | G11C 11/16 |
| | | | 365/158 |
| 2017/0076770 A1 | 3/2017 | Daibou et al. | |
| 2018/0040358 A1 | 2/2018 | Noguchi et al. | |
| 2018/0151210 A1 | 5/2018 | Li et al. | |
| 2019/0180173 A1 | 6/2019 | Torng et al. | |
| 2019/0305216 A1 | 10/2019 | Gosavi et al. | |
| 2019/0386205 A1 | 12/2019 | Gosavi et al. | |
| 2020/0006627 A1 | 1/2020 | Manipatruni et al. | |
| 2020/0006637 A1 | 1/2020 | Gosavi et al. | |
| 2020/0083286 A1 | 3/2020 | Manipatruni et al. | |
| 2020/0279597 A1 | 9/2020 | Wang et al. | |
| 2020/0295002 A1 | 9/2020 | Snyder et al. | |
| 2020/0395530 A1 | 12/2020 | Tsou et al. | |
| 2021/0005228 A1 | 1/2021 | Ghosh | |
| 2021/0020695 A1 | 1/2021 | Bak et al. | |
| 2021/0050300 A1 | 2/2021 | Lin et al. | |
| 2021/0050508 A1 | 2/2021 | Lee et al. | |
| 2021/0074910 A1 | 3/2021 | Saito et al. | |
| 2021/0104551 A1 | 4/2021 | Lin et al. | |
| 2021/0125651 A1 | 4/2021 | Wang et al. | |
| 2021/0125654 A1 | 4/2021 | Endoh et al. | |
| 2021/0134339 A1* | 5/2021 | Song | G11C 11/18 |
| 2021/0134882 A1 | 5/2021 | Lin et al. | |
| 2021/0202827 A1 | 7/2021 | Song et al. | |
| 2022/0173162 A1* | 6/2022 | Sasaki | H10N 50/80 |
| 2023/0110711 A1 | 4/2023 | Mishra et al. | |
| 2023/0147268 A1* | 5/2023 | Endoh | H10N 52/85 |
| | | | 257/421 |

FOREIGN PATENT DOCUMENTS

| | | |
|---|---|---|
| EP | 3683829 A1 | 7/2020 |
| KR | 20200003732 A | 1/2020 |
| KR | 20210089076 A | 7/2021 |
| KR | 1020230052116 | 4/2023 |
| KR | 1020230060979 | 5/2023 |

OTHER PUBLICATIONS

Jang, Yunho , et al., "Area and Energy Efficient Joint 2T SOT-MRAM-Based on Diffusion Region Sharing With Adjacent Cells", IEEE Transactions on Circuits and Systems—II: Express Briefs, vol. 69, No. 3, Mar. 2022, 5 pages.

Manchon, A. , et al., "Current-induced spin-orbit torques in ferromagnetic and antiferromagnetic systems", Reviews of Modern Physics, vol. 91, Jul-Sep. 2019, 035004-1-035004-80.

Mishra, Rahul , et al., "Shared-Write-Channel-Based Device for High-Density Spin-Orbit-Torque Magnetic Random-Access Memory", Physical Review Applied, 15, 024063, Feb. 25, 2021, 024063-1-024063-9.

Seo, Yeongkyo , et al., "Area-Efficient SOT-MRAM with a Schottky Diode", IEEE Electron Device Letters, vol. 37, Issue 8, Aug. 2016, pp. 982-985.

* cited by examiner

SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2021-0160628, filed on Nov. 19, 2021, in the Korean Intellectual Property Office, the entire contents of which are hereby incorporated by reference.

BACKGROUND

The present disclosure relates to a semiconductor memory device, and in particular, to a spin-orbit torque (SOT)-based semiconductor memory device.

As the demand for electronic devices having increased speed and/or reduced power consumption characteristics increases, the demand for semiconductor memory devices with faster operating speeds and/or lower operating voltages is increasing. Magnetic memory devices have been proposed to satisfy such a demand. The magnetic memory device may have technical advantages, such as reduced latency and/or non-volatility, and thus, it is emerging as a next-generation semiconductor memory device. Accordingly, various studies are being conducted to develop a magnetic memory device with higher integration density and/or lower power consumption.

SUMMARY

Embodiments of the inventive concept provide a spin-orbit torque (SOT)-based semiconductor memory device of a high integration density.

According to some embodiments of the inventive concept, a semiconductor memory device may include a magnetic tunnel junction pattern, a spin-orbit torque (SOT) pattern in contact with a first portion of the magnetic tunnel junction pattern, a first transistor electrically connected to a second portion of the magnetic tunnel junction pattern and configured to be controlled by a first word line, and a second transistor electrically connected to a first end of the spin-orbit torque pattern and configured to be controlled by a second word line. An effective channel width of the first transistor may be different from an effective channel width of the second transistor.

According to some embodiments of the inventive concept, a semiconductor memory device may include a first word line and a second word line that extend in a first direction, a bit line and a source line that extend in a second direction that is perpendicular to the first direction, and a plurality of memory cells. Each of the plurality of memory cells may include a spin-orbit torque (SOT) pattern having a first end electrically connected to the source line, and having a second end that is opposite to the first end, a magnetic tunnel junction pattern on the SOT pattern, a first transistor electrically connected to a first end of the magnetic tunnel junction pattern wherein the first transistor is between the first end of the magnetic tunnel junction pattern and the bit line and is configured to be controlled by the first word line, and a second transistor electrically connected to the second end of the SOT pattern wherein the second transistor is between the second end of the SOT pattern and the bit line and is configured to be controlled by the second word line. The first word line and the second word line may cross an active region of a semiconductor substrate, and an overlapping area between the first word line and the active region may be smaller than an overlapping area between the second word line and the active region.

According to some embodiments of the inventive concept, a semiconductor memory device may include a semiconductor substrate including a first cell region and a second cell region, each of the first and second cell regions including first and second active patterns which protrude from the semiconductor substrate, a first writing word line on the first cell region wherein the first writing word line crosses the first and second active patterns, a second writing word line on the second cell region wherein the second writing word line crosses the first and second active patterns, a first reading word line on the first cell region, wherein the first reading word line i spaced apart from the first active pattern, crosses the second active pattern and is between the first and second writing word lines, a second reading word line on the second cell region wherein the second reading word line is spaced apart from the first active pattern, crosses the second active pattern, and is between the first reading word line and the second writing word line, first source/drain patterns at a side of the first writing word line and at an opposite side of the second writing word line, second source/drain patterns between the first reading and writing word lines and between the second reading and writing word lines, a third source/drain pattern between the first and second reading word lines, first and second magnetic tunnel junction patterns electrically connected to the second source/drain patterns, respectively, first and second spin-orbit torque (SOT) patterns on the first and second magnetic tunnel junction patterns, respectively, a source line that crosses the first and second writing word lines and the first and second reading word lines and is electrically connected to the first and second SOT patterns, and a bit line that crosses the first and second writing word lines and the first and second reading word lines and is electrically connected to the second source/drain patterns.

DETAILED DESCRIPTION

Example embodiments of the inventive concepts will now be described more fully with reference to the accompanying drawings, in which example embodiments are shown.

Figure 1A:
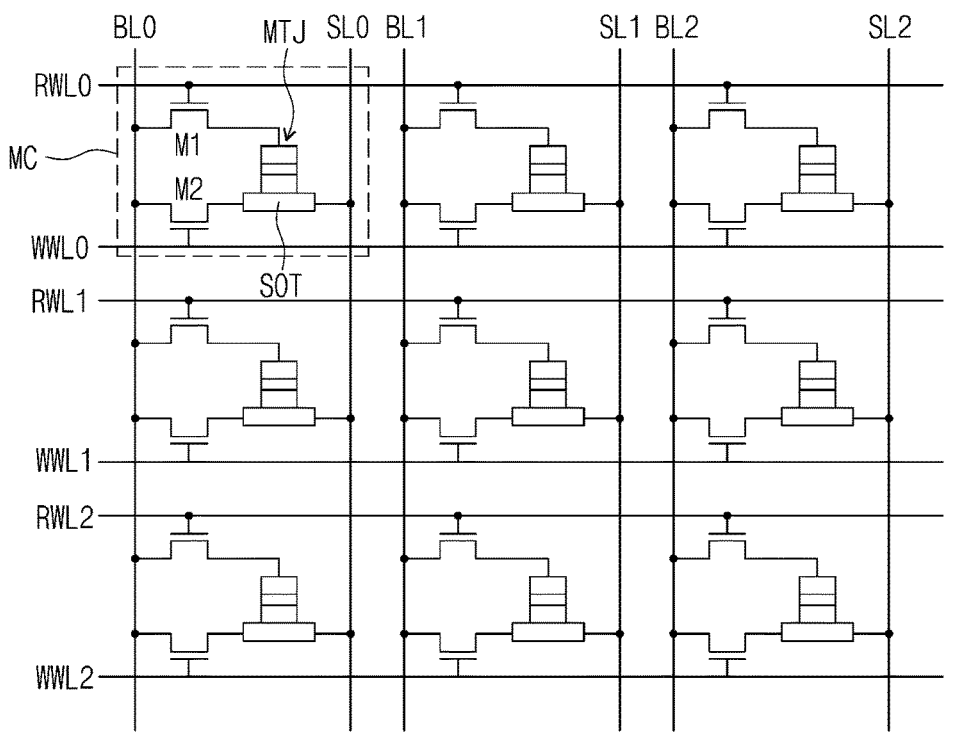
FIG. 1A is a circuit diagram illustrating a cell array of a semiconductor memory device according to some embodiments of the inventive concept.
Figure 1B:
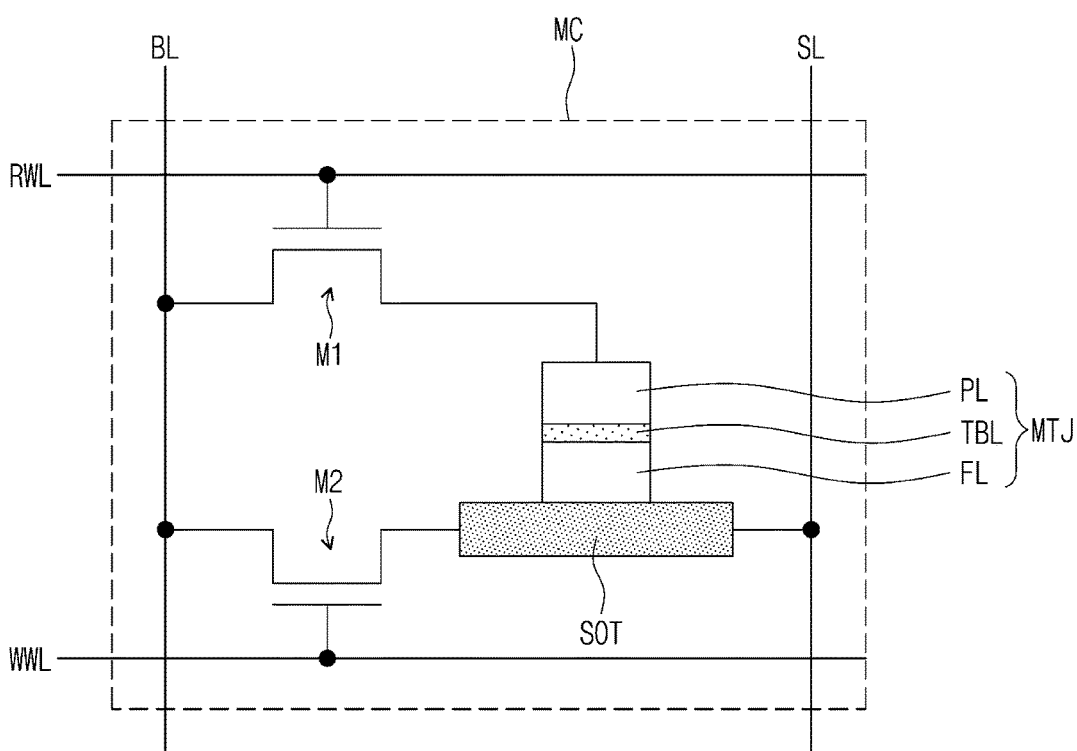
FIG. 1B is a circuit diagram schematically illustrating a memory cell of a semiconductor memory device according to some embodiments of the inventive concept.

FIG. 1A is a circuit diagram illustrating a cell array of a semiconductor memory device according to some embodiments of the inventive concept. FIG. 1B is a circuit diagram schematically illustrating a memory cell of a semiconductor memory device according to some embodiments of the inventive concept.

Referring to FIGS. 1A and 1B, the cell array may include a plurality of writing word lines WWL0, WWL1, and WWL2, a plurality of reading word lines RWL0, RWL1, and RWL2, a plurality of bit lines BL0, BL1, and BL2, a plurality of source lines SL0, SL1, and SL2, and a plurality of memory cells MC.

The memory cells MC may be arranged to form a plurality of rows and a plurality of columns. The memory cells MC of each row may be connected to a pair of reading and writing word lines RWL0-2 and WWL0-2. The memory cells MC of each column may be connected to a pair of source and bit lines SL and BL.

First transistors M1 of the memory cells MC of each row may be connected in common to a corresponding reading word line RWL0-2, and second transistors M2 of the memory cells MC of each row may be connected in common to a corresponding writing word line WWL0-2.

Spin-orbit torque (SOT) patterns SOT of the memory cells MC of each column may be connected in common to a corresponding one of the source lines SL, and the first and second transistors M1 and M2 of the memory cells MC of each column may be connected in common to a corresponding one of the bit lines BL.

Each of the memory cells MC may include a magnetic tunnel junction (MTJ) pattern MTJ, a spin-orbit torque (SOT) pattern SOT, the first or reading transistor M1, and the second or writing transistor M2.

In more detail, the MTJ pattern MTJ may be disposed between the SOT pattern SOT and a first source/drain electrode of the first transistor M1. The MTJ pattern MTJ may include a pinned magnetic pattern PL, a free magnetic pattern FL, and a tunnel barrier pattern TBL therebetween, as shown in FIG. 1B.

The free magnetic pattern FL may be disposed between the SOT pattern SOT and the tunnel barrier pattern TBL, and the pinned magnetic pattern PL may be spaced apart from the free magnetic pattern FL with the tunnel barrier pattern TBL interposed therebetween. The free magnetic pattern FL may have a first surface and a second surface, which are opposite to each other and are in contact with the tunnel barrier pattern TBL and the SOT pattern SOT, respectively.

The free magnetic pattern FL may have a magnetization direction, which can be changed by the SOT pattern SOT. The free magnetic pattern FL may have a perpendicular magnetic anisotropy. The structure of the free magnetic pattern FL may be modified to a single-layered or multi-layered structure.

The free magnetic pattern FL may be formed of or include at least one of magnetic materials (e.g., iron (Fe), cobalt (Co), nickel (Ni), boron (B), silicon (Si), platinum (Pt), palladium (Pd), and/or alloys thereof).

The free magnetic pattern FL may be formed of or include at least one of intrinsic and/or extrinsic perpendicular magnetic materials. The intrinsic perpendicular magnetic material may include a material exhibiting a perpendicular magnetization property, even when there is no external cause. The extrinsic perpendicular magnetic material may include a material, which exhibits an intrinsic in-plane magnetization property when there is no external cause but exhibits a perpendicular magnetization property by an external cause. As an example, the free magnetic pattern FL may be a cobalt layer. As another example, the free magnetic pattern FL may be formed of or include $Co_{60}Fe_{20}B_{20}$.

The pinned magnetic pattern PL may be disposed between the first source/drain electrode of the first transistor M1 and the tunnel barrier pattern TBL. The pinned magnetic pattern PL may have a fixed magnetization direction and may have a perpendicular magnetic anisotropy. The pinned magnetic pattern PL may have a synthetic anti-ferromagnetic (SAF) structure. In this case, the pinned magnetic pattern PL may include a first pinned pattern, a second pinned pattern, and an exchange coupling pattern between the first and second pinned patterns. The first pinned pattern may be formed of or include a magnetic material, and a magnetization direction of the first pinned pattern may be fixed by the second pinned pattern. The first pinned pattern and the second pinned pattern may be coupled to each other in an anti-parallel manner by the exchange coupling pattern. In some embodiments, the pinned magnetic pattern PL may be formed of or include at least one of Co, Al, Ir, Ru, Pt, Ta, or Hf. In some embodiments, the pinned magnetic pattern PL may be formed of or include at least one of Ni, Fe, Co, B, Ge, Mn, and/or alloys of Ni, Fe, Co, B, Ge, and Mn. In some embodiments, the pinned magnetic pattern PL may be formed of or include compounds or mixtures (e.g., NiFe, CoFe, or CoFeB) including the above elements. In some embodiments, the pinned magnetic pattern PL may include one of, for example, Co/Pt, Co/Pd, and/or Co/Ni super lattices.

The tunnel barrier pattern TBL may be formed of or include at least one of magnesium oxide, titanium oxide, aluminum oxide, magnesium-zinc oxide, or magnesium-boron oxide.

The SOT pattern SOT may be configured to exert a spin-orbit torque on the free magnetic pattern FL of the MTJ pattern MTJ. A portion of the SOT pattern SOT may be in contact with the free magnetic pattern FL. The SOT pattern SOT may switch the magnetization direction of the free magnetic pattern FL using a spin Hall effect or a Rashba effect which is caused by a spin-orbit torque when there is an in-plane current passing through the SOT pattern SOT adjacent to the free magnetic pattern FL.

The SOT pattern SOT may have a first end and a second end, which are opposite to each other. The first end of the SOT pattern SOT may be connected to a first source/drain electrode of the second transistor M2 of the SOT pattern SOT. The second end of the SOT pattern SOT may be connected to the source line SL.

In some embodiments, the SOT pattern SOT may be formed of or include at least one of heavy metals or materials doped with heavy metals. The SOT pattern SOT may include a non-magnetic material. For example, the SOT pattern SOT may be formed of or include at least one of tantalum (Ta), platinum (Pt), bismuth (Bi), titanium (Ti), or tungsten (W).

The first transistor M1 of the memory cell MC may be provided between and connected to the MTJ pattern MTJ and the bit line BL. A gate electrode of the first transistor M1 may be connected to a reading word line RWL. The first transistor M1 may be used to control an electric connection between the MTJ pattern MTJ and the bit line BL.

The second transistor M2 of the memory cell MC may be provided between and connected to the first end of the SOT pattern SOT and the bit line BL. A gate electrode of the second transistor M2 may be connected to a writing word line WWL. The second transistor M2 may be used to control an electric connection between the SOT pattern SOT and the bit line BL.

The bit line BL may be connected to a sense amplifier (not shown). The sense amplifier may compare a sensing voltage of the bit line BL with a reference voltage to determine data, which is stored in the memory cell MC, and then may output the data to the outside. In the cell array, each bit line BL may be connected in common to memory cells of each column.

The source line SL may be connected to the second end of the SOT pattern SOT. In the cell array, each source line SL may be connected in common to memory cells of each column.

When a writing operation is performed on a selected memory cell, the second transistor M2 may be turned on by the writing word line WWL and the first transistor M1 may be turned off. Accordingly, a writing current may flow through the SOT pattern SOT. A direction of the writing current may be changed, depending on voltages applied to the bit line BL and the source line SL.

The writing current may be an in-plane current exerting a spin-orbit torque on the free magnetic pattern FL of the MTJ pattern MTJ. The writing current may flow parallel to an interface between the SOT pattern SOT and the free magnetic pattern FL of the MTJ pattern MTJ and along a region adjacent thereto. Due to the spin Hall effect and the Rashba effect, there may be a spin current flowing in a direction, which is perpendicular to the interface between the SOT pattern SOT and the free magnetic pattern FL of the MTJ pattern MTJ, during the flow of the writing current, and as a result, a spin-orbit torque may be exerted on the MTJ pattern MTJ. A magnetization direction of the free magnetic pattern FL of the MTJ pattern MTJ may be switched to be substantially parallel or antiparallel to a magnetization direction of the pinned magnetic pattern PL, depending on an amount of the writing current induced along a surface of the SOT pattern SOT.

When a reading operation is performed on a selected memory cell, the first transistor M1 may be turned on by the reading word line RWL, and the second transistor M2 may be turned off. During the reading operation, a reading current may flow from the bit line BL to the source line SL. The reading current may flow through a portion of the SOT pattern SOT and the MTJ pattern MTJ. The reading current may be produced to flow through the MTJ pattern MTJ in a direction, which is perpendicular to an interface between the SOT pattern SOT and the MTJ pattern MTJ.

Figure 2:
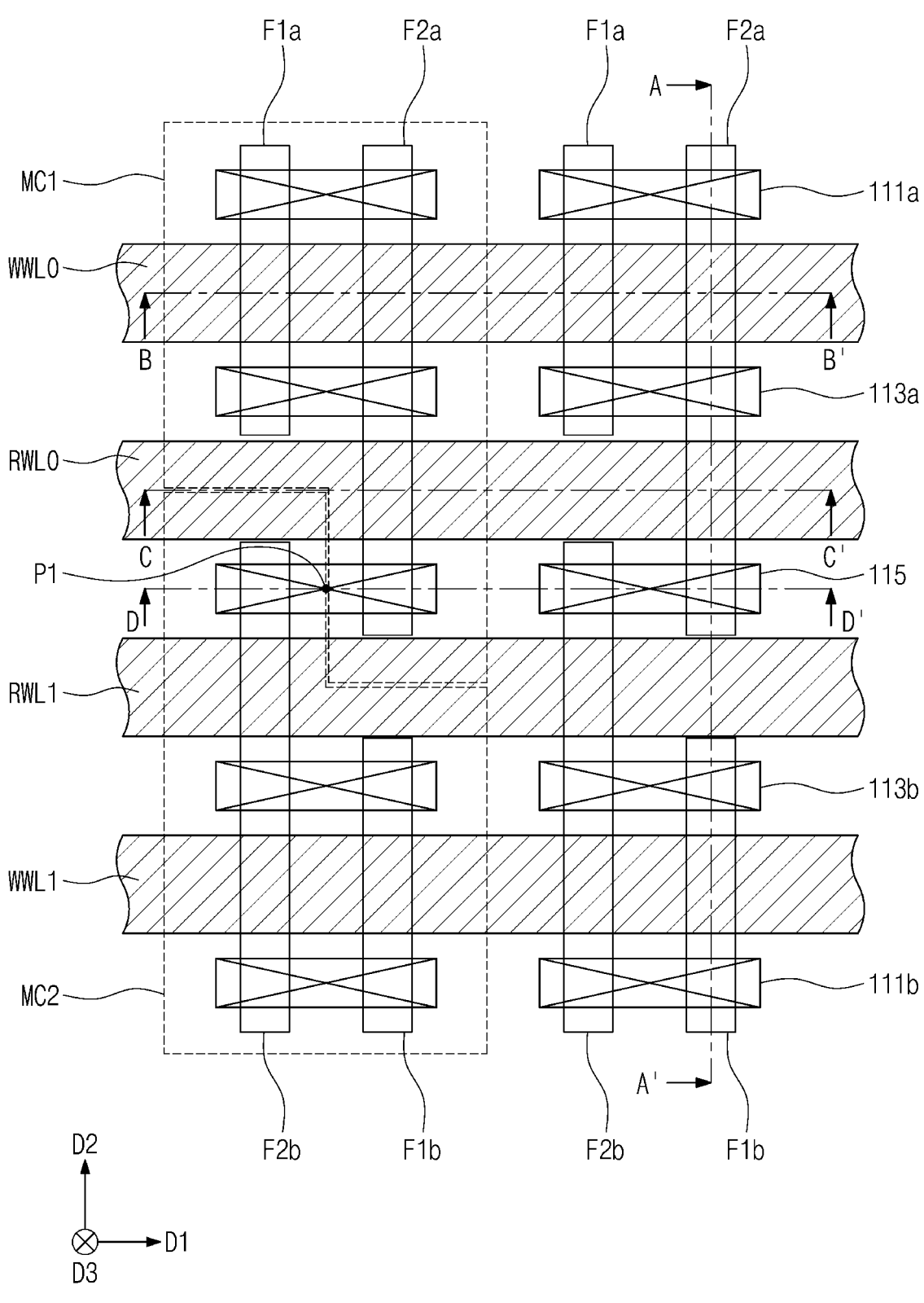
FIG. 2 is a plan view illustrating first and second transistors, which are provided in a cell array of a semiconductor memory device according to some embodiments of the inventive concept.
Figure 3A:
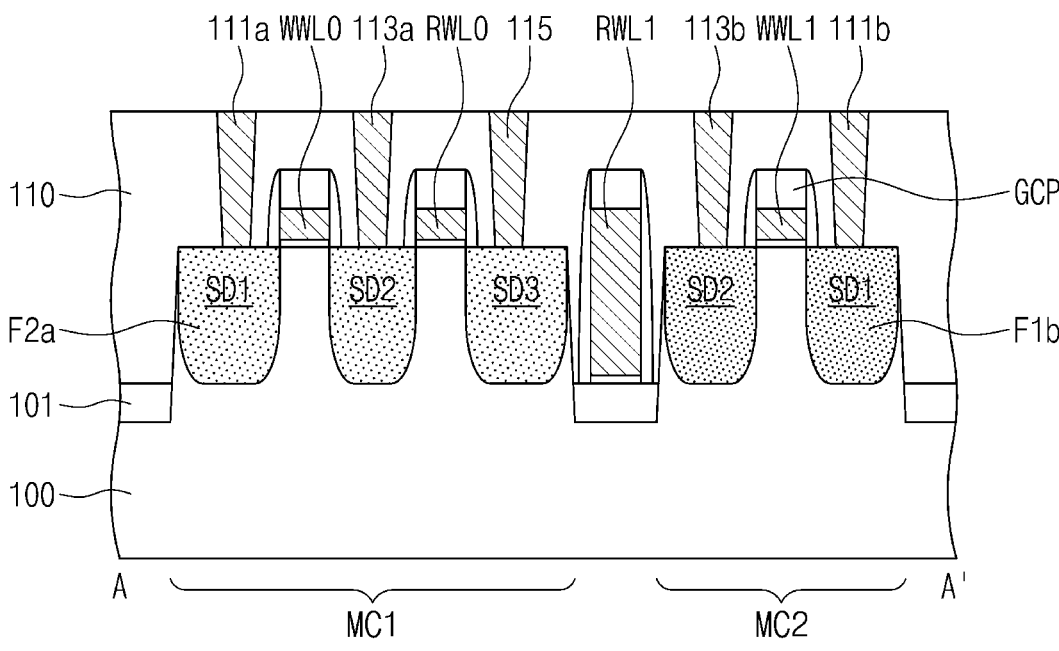
FIGS. 3A, 3B, 3C, and 3D are sectional views, which are respectively taken along lines A-A', B-B', C-C', and D-D' of FIG. 2 to illustrate a semiconductor memory device according to some embodiments of the inventive concept.
Figure 3B:
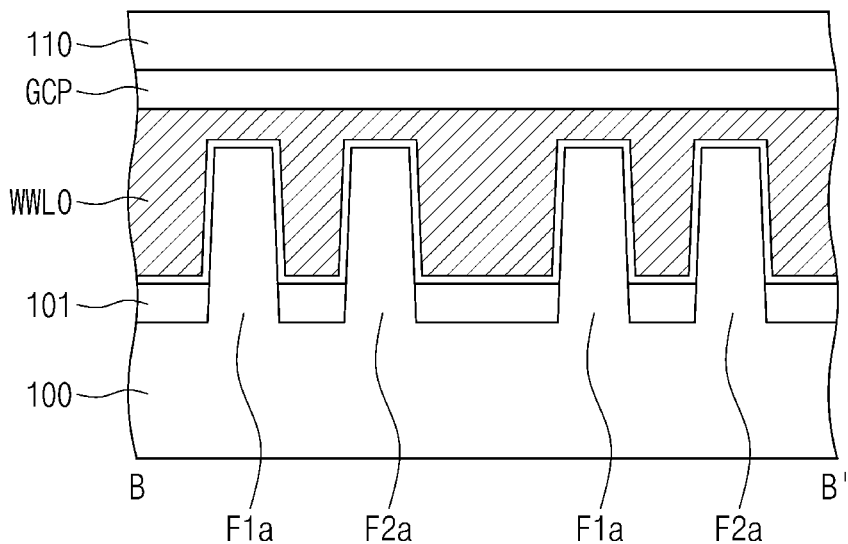
Figure 3C:
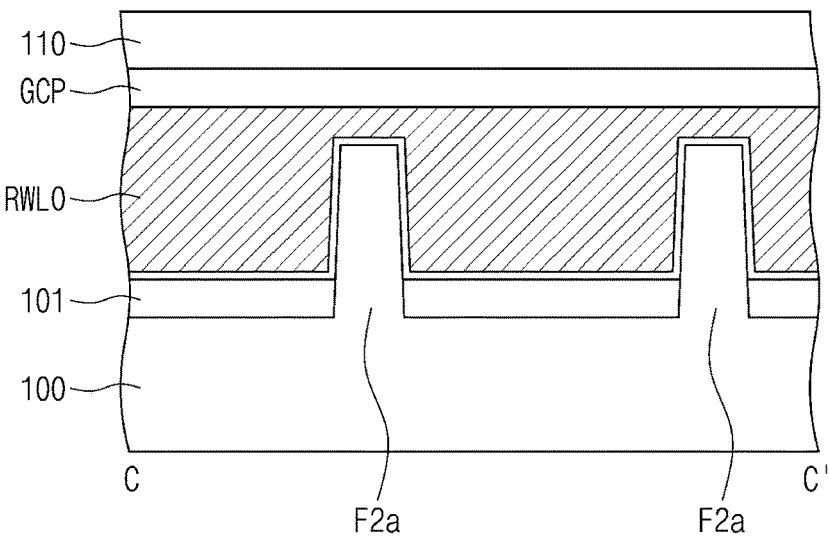
Figure 3D:
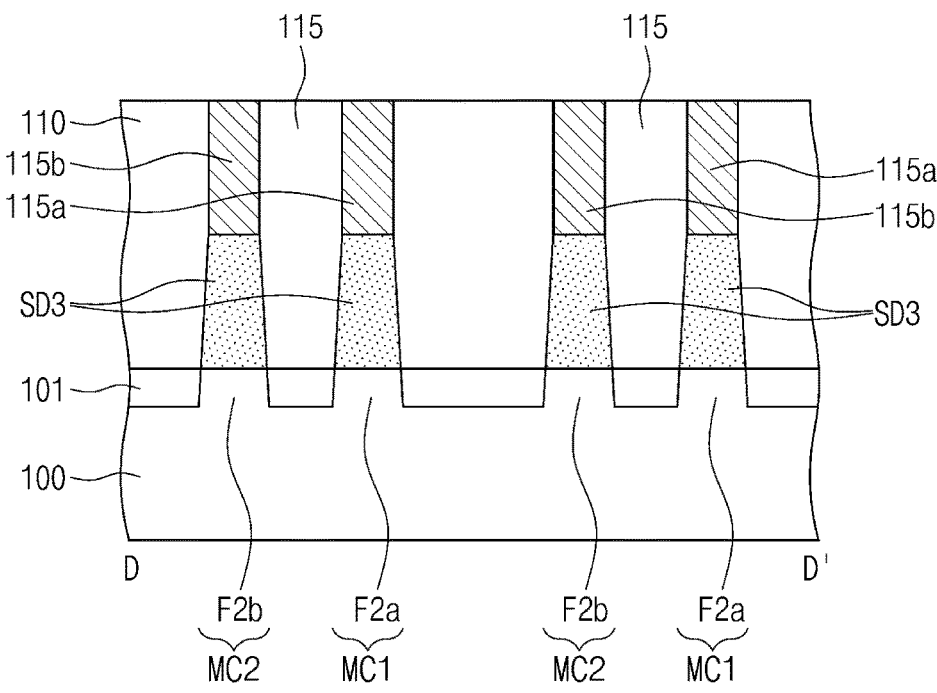

FIG. 2 is a plan view illustrating first and second transistors, which are provided in a cell array of a semiconductor memory device according to some embodiments of the inventive concept. FIGS. 3A, 3B, 3C, and 3D are sectional views, which are respectively taken along lines A-A', B-B', C-C', and D-D' of FIG. 2 to illustrate a semiconductor memory device according to some embodiments of the inventive concept.

Referring to FIGS. 2, 3A, 3B, 3C, and 3D, a semiconductor substrate 100 including first cell regions MC1 and second cell regions MC2 may be provided. In some embodiments, the semiconductor substrate 100 may be a silicon wafer, a germanium wafer, or a silicon germanium wafer. The first cell regions MC1 may be arranged in a first direction D1, and the second cell regions MC2 may be adjacent to the first cell regions MC1 in a second direction D2 crossing the first direction D1. In other words, the first cell regions MC1 and the second cell regions MC2 may be next to one another with respect to the second direction D2.

In each of the first and second cell regions MC1 and MC2, the semiconductor substrate 100 may include first and second active patterns F1a/F1b and F2a/F2b. The first and second active patterns F1a/F1b and F2a/F2b may be spaced apart from each other in the first direction D1 and may be extended in the second direction D2 and parallel to each other. Each of the first and second active patterns F1a/F1b and F2a/F2b may be a vertically-protruding portion of the semiconductor substrate 100.

The first and second active patterns F1a/F1b and F2a/F2b may have different lengths from each other in the second direction D2. As an example, when measured in the second direction D2, the first active pattern F1a/F1b may have a first length, and the second active pattern F2a/F2b may have a second length larger than the first length.

The first and second active patterns F1b and F2b of the second cell region MC2 may be spaced apart from the first and second active patterns F1a and F2a of the first cell region MC1 in the second direction D2. When viewed in a plan view, the first and second active patterns F1b and F2b of the second cell region MC2 and the first and second active patterns F1a and F2a of the first cell region MC1 may be arranged to have a point symmetry about a first symmetry point P1. When viewed in a plan view, the first and second active patterns F1a/F1b and F2a/F2b of the first and second cell regions MC1 and MC2 may be partially overlapped with each other in the first direction D1.

Device isolation patterns 101 may be disposed between the first and second active patterns F1a/F1b and F2a/F2b. Top surfaces of the device isolation patterns 101 may be located at a level lower than top surfaces of the first and second active patterns F1a/F1b and F2a/F2b, and upper portions of the first and second active patterns F1a/F1b and F2a/F2b may protrude from the top surfaces of the device isolation patterns 101 in an upward direction. The device isolation patterns 101 may be formed of or include at least one of, for example, silicon oxide, silicon oxynitride, or silicon nitride.

First and second writing word lines WWL0 and WWL1 and first and second reading word lines RWL0 and RWL1 may be disposed on the semiconductor substrate 100 to be spaced apart from each other by a specific distance. The first and second reading word lines RWL0 and RWL1 may be disposed between the first and second writing word lines WWL0 and WWL1. The first and second writing word lines WWL0 and WWL1 and the first and second reading word lines RWL0 and RWL1 may be disposed on the semiconductor substrate 100, and a gate dielectric layer may be interposed therebetween. Gate capping patterns GCP may be respectively disposed on the first and second writing word lines WWL0 and WWL1 and the first and second reading word lines RWL0 and RWL1.

The first and second writing word lines WWL0 and WWL1 and the first and second reading word lines RWL0 and RWL1 may be formed of or include at least one of doped semiconductor materials (e.g., doped silicon), metallic materials (e.g., tungsten, aluminum, titanium, and/or tantalum), conductive metal nitrides (e.g., titanium nitride, tantalum nitride, and/or tungsten nitride), or metal-semiconductor compounds (e.g., metal silicide). The gate capping patterns GCP may be formed of or include at least one of insulating materials (e.g., silicon oxide or silicon nitride).

The first and second writing word lines WWL0 and WWL1 may be extended in the first direction D1 to cross the first and second active patterns F1a/F1b and F2a/F2b and may be spaced apart from each other in the second direction D2. The first and second writing word lines WWL0 and WWL1 may be provided to cover or overlap opposite side surfaces and top surfaces of the first and second active patterns F1a/F1b and F2a/F2b.

The first and second reading word lines RWL0 and RWL1 may be extended in the first direction D1 to cross the second active patterns F2a/F2b and may be spaced apart from each other in the second direction D2. The first and second reading word lines RWL0 and RWL1 may be provided to cover or overlap opposite side surfaces and top surfaces of the second active patterns F2a/F2b.

In some embodiments, the first and second transistors of each memory cell may be fin-type FETs having fin-shaped channels protruding from the semiconductor substrate 100.

The first reading word line RWL0 may be provided to cross the second active patterns F2a of the first cell regions MC1. Portions of the first reading word line RWL0 may be disposed between the first active pattern F1a of the first cell region MC1 and the second active pattern F2b of the second cell region MC2.

The second reading word line RWL1 may be provided to cross the second active patterns F2b of the second cell regions MC2. Portions of the second reading word line RWL1 may be disposed between the second active pattern F2a of the first cell region MC1 and the first active pattern F1b of the second cell region MC2.

First source/drain patterns SD1 may be provided in upper portions of the first and second active patterns Fla, F2a/F 1b, and F2b, which are located at a side of the first writing word line WWL0 and at an opposite side of the first writing word line WWL1.

Second source/drain patterns SD2 may be provided in upper portions of the first and second active patterns F1a, F2a/F1b, and F2b, which are located between the first writing word line WWL0 and the first reading word line RWL0 and between the second writing word line WWL1 and the second reading word line RWL1.

Third source/drain patterns SD3 may be provided in upper portions of the second active patterns F2a and F2b, which are located between the first and second reading word lines RWL0 and RWL1.

In some embodiments, a top surface of each of the first, second, and third source/drain patterns SD1, SD2, and SD3 may be located at substantially the same level as the top surfaces of the first and second active patterns F1a, F2a/F1b, and F2b. In some embodiments, the top surfaces of the first, second, and third source/drain patterns SD1, SD2, and SD3 may be higher than the top surface of the first and second active patterns F1a, F2a/F1b, and F2b adjacent thereto.

The first, second, and third source/drain patterns SD1, SD2, and SD3 may be doped to have a conductivity type different from that of the first and second active patterns F1a, F2a/F1b, and F2b. The first, second, and third source/drain patterns SD1, SD2, and SD3 may be formed of a semiconductor material having a different lattice constant from that of the first and second active patterns F1a, F2a/F1b, and F2b. In some embodiments, the first, second, and third source/drain patterns SD1, SD2, and SD3 may be formed of or include silicon carbide or silicon germanium. A metal silicide layer (not shown) may be disposed on the first, second, and third source/drain patterns SD 1, SD2, and SD3.

In some embodiments, the first and second source/drain patterns SD1 and SD2 and the first writing word line WWL0 may be a first transistor (e.g., M1 of FIGS. 1A and 1B) of a first memory cell. The second and third source/drain patterns SD2 and SD3 and the first reading word line RWL0 may be a second transistor (e.g., M2 of FIGS. 1A and 1B) of the first memory cell.

The first and second source/drain patterns SD1 and SD2 and the second writing word line WWL1 may be a first transistor (e.g., M1 of FIGS. 1A and 1B) of a second memory cell. The second and third source/drain patterns SD2 and SD3 and the second reading word line RWL1 may be a second transistor (e.g., M2 of FIGS. 1A and 1B) of the second memory cell.

In some embodiments, a channel width of the first or reading transistor (e.g., M1 of FIGS. 1A and 1B) may be smaller than a channel width of the second or writing transistor (e.g., M2 of FIGS. 1A and 1B). In other words, an overlapping area between the first and second writing word lines WWL0 and WWL1 and the first and second active patterns F1a/F1b and F2a/F2b may be larger than an overlapping area between the first and second reading word lines RWL0 and RWL1 and the second active patterns F2a/F2b. In this case, a current driving ability of the second transistor M2 of FIGS. 1A and 1B may be greater than a current driving ability of the first transistor M1 of FIGS. 1A and 1B, and thus, it may be possible to reduce an energy required for a writing operation on a memory cell.

A first interlayer insulating layer 110 may be disposed on a front surface of the semiconductor substrate 100. The first interlayer insulating layer 110 may cover or overlap the first, second, and third source/drain patterns SD1, SD2, and SD3. The first interlayer insulating layer 110 may be formed of or include at least one of nitride materials (e.g., silicon nitride) and/or oxynitride materials (e.g., silicon oxynitride).

First, second, and third active contact patterns 111a/111b, 113a/113b, and 115a/115b may be provided to penetrate the first interlayer insulating layer 110 and may be coupled to the first, second, and third source/drain patterns SD1, SD2, and SD3, respectively. When viewed in a plan view, the first, second, and third active contact patterns 111a/111b, 113a/113b, and 115a/115b may be bar-shaped patterns extended in the first direction D1. The third active contact pattern 115a/115b may be connected to each of the second active patterns F2a and F2b of the first and second cell regions MC1 and MC2 or may be connected in common to both of the second active patterns F2a and F2b of the first and second cell regions MC1 and MC2.

Each of the first, second, and third active contact patterns 111a/111b, 113a/113b, and 115 may include a barrier metal pattern and a metal pattern. The first, second, and third active contact patterns 111a/111b, 113a/113b, and 115 may be formed of or include at least one of metallic materials (e.g., tungsten, titanium, tantalum, and cobalt) and/or conductive metal nitrides (e.g., titanium nitride, tantalum nitride, and/or tungsten nitride).

Silicide patterns (not shown) may be respectively interposed between the first, second, and third active contact patterns 111a/111b, 113a/113b, and 115 and the first, second, and third source/drain patterns SD1, SD2, and SD3. The silicide pattern may be formed of or include at least one of metal silicide materials (e.g., titanium silicide, tantalum silicide, tungsten silicide, nickel silicide, and/or cobalt silicide).

In some embodiments, the first and second transistors M1 and M2 of each memory cell may be a three-dimensional field effect transistor (e.g., a multi-bridge-channel FET (MBCFET) or a gate-all-around FET (GAAFET)), in which a gate electrode is provided to three-dimensionally surround a nano wire channel or a nano sheet channel. In this case, the semiconductor memory device may include channel patterns, which are stacked on each of the first and second active patterns F1a/F1b and F2a/F2b to be vertically spaced apart from each other, and each of the first and second writing and reading word lines WWL0, WWL1, RWL0, and RWL1 may be provided to surround the channel patterns.

Figure 4:
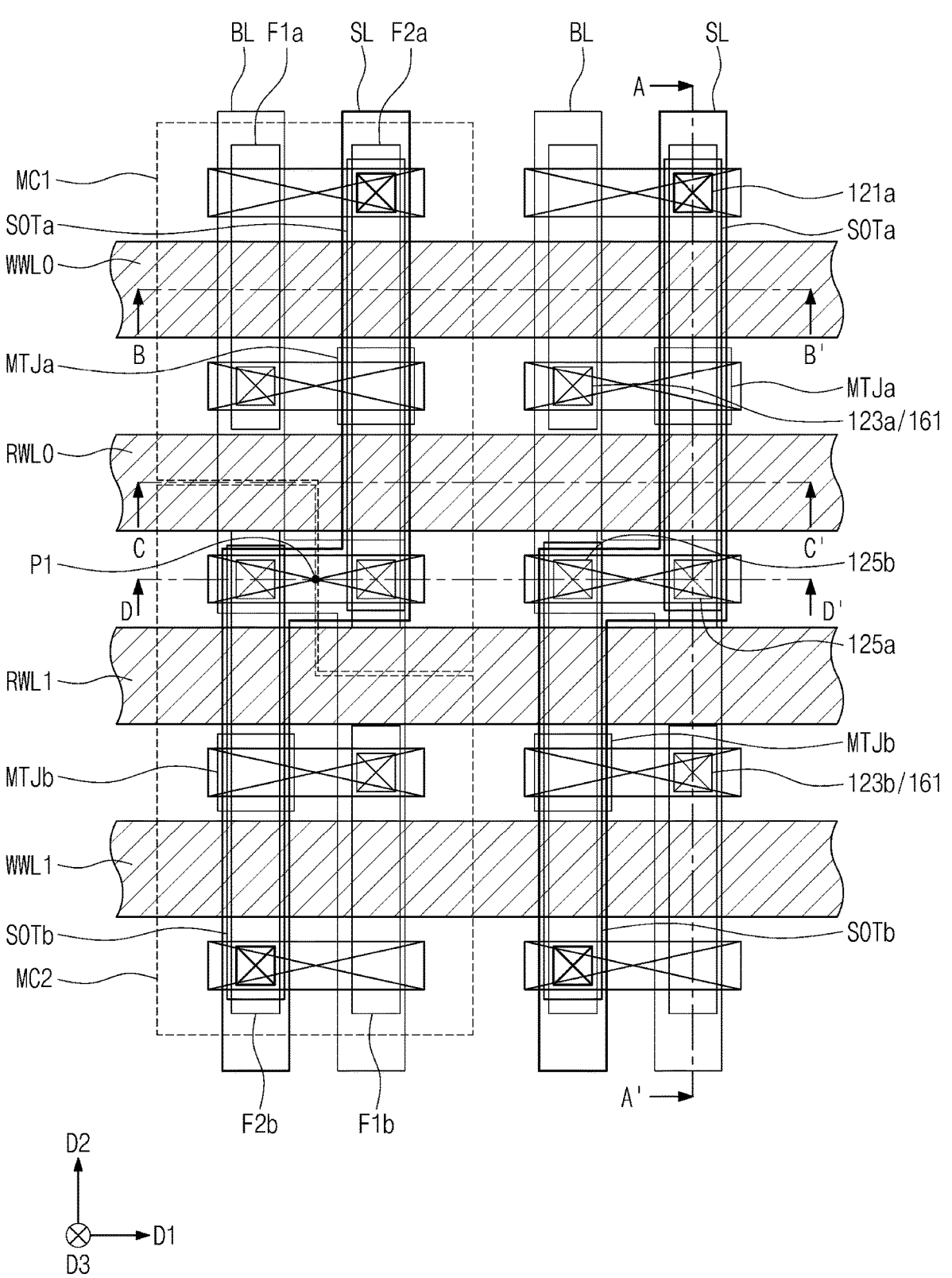
FIG. 4 is a plan view illustrating a cell array of a semiconductor memory device according to some embodiments of the inventive concept.

FIG. 4 is a plan view illustrating a cell array of a semiconductor memory device according to some embodiments of the inventive concept. FIGS. 5A, 5B, 5C, and 5D are sectional views, which are respectively taken along lines A-A', B-B', C-C', and D-D' of FIG. 4 to illustrate a semiconductor memory device according to some embodiments of the inventive concept.

As previously described with reference to FIGS. 2, 3A, 3B, 3C, and 3D, the first and second transistors of the memory cells may be provided on the first and second cell regions. The first and second memory cells may be configured to have the same features and structures as those described with reference to FIGS. 2, 3A, 3B, 3C, and 3D, and thus, a detailed description thereof will be omitted.

Referring to FIGS. 4, 5A, 5B, 5C, and 5D, a second interlayer insulating layer 120 may be disposed on the first interlayer insulating layer 110, and first, second, and third lower plugs 121a/121b, 123a/123b, and 125a/125b may be disposed in the second interlayer insulating layer 120. The first lower plugs 121a/121b may be coupled to the first active contact patterns 111a and 111b, and the second lower plugs 123a and 123b may be coupled to the second active contact patterns 113a and 113b. The third lower plugs 125a/125b may be coupled to the third active contact patterns 115a/115b.

First, second, and third conductive patterns 131, 133, and 135 may be disposed on the second interlayer insulating layer 120. The first conductive pattern 131 may be coupled to the first lower plug 121a/121b, and the second conductive pattern 133 may be coupled to the second lower plug 123a and 123b. The third conductive pattern 135 may be coupled to the third lower plug 125a/125b.

A third interlayer insulating layer 130 may be disposed on the second interlayer insulating layer 120. First and second MTJ patterns MTJa and MTJb may be disposed on the third interlayer insulating layer 130. Each of the first and second MTJ patterns MTJa and MTJb may be connected to the third conductive pattern 135 through a lower contact plug 139. In other words, the first and second MTJ patterns MTJa and MTJb may be electrically connected to the third source/drain patterns SD3, respectively.

Each of the first and second MTJ patterns MTJa and MTJb may include the free magnetic pattern FL, the pinned magnetic pattern PL, and the tunnel barrier pattern TBL therebetween, as previously described with reference to FIG. 1B.

Each of the first and second MTJ patterns MTJa and MTJb may further include lower and upper electrodes (not shown), and in this case, the free magnetic pattern FL, the pinned magnetic pattern PL, and the tunnel barrier pattern TBL therebetween may be disposed between the lower and upper electrodes. In some embodiments, the first and second MTJ patterns MTJa and MTJb may be provided to have the same stacking structure.

The first and second MTJ patterns MTJa and MTJb, which include magnetic materials, may be formed by a patterning process. Each of the first and second MTJ patterns MTJa and MTJb may have substantially the same width in the first and second directions D1 and D2. An upper width of each of the first and second MTJ patterns MTJa and MTJb may be smaller than a lower width thereof. In this case, each of the first and second MTJ patterns MTJa and MTJb may have a substantially trapezoidal vertical section.

A fourth interlayer insulating layer 140 may be disposed on the third interlayer insulating layer 130. In some embodiments, the fourth interlayer insulating layer 140 may fill a space between the first and second MTJ patterns MTJa and MTJb. The fourth interlayer insulating layer 140 may be formed of or include at least one of oxide materials (e.g., silicon oxide), nitride materials (e.g., silicon nitride), and/or oxynitride materials (e.g., silicon oxynitride).

A first connection contact plug 141a/141b may be provided to penetrate the third and fourth interlayer insulating layers 130 and 140 and may be coupled to the first conductive pattern 131.

First and second SOT patterns SOTa and SOTb may be disposed on the fourth interlayer insulating layer 140. The first SOT pattern SOTa may be provided in the first cell region MC1, and the second SOT pattern SOTb may be provided in the second cell region MC2.

The first and second SOT patterns SOTa and SOTb may be connected to the first and second MTJ patterns MTJa and MTJb, respectively. The first and second SOT patterns SOTa and SOTb may be adjacent to or in contact with the free magnetic patterns FL of the first and second MTJ patterns MTJa and MTJb. Each of the first and second SOT patterns SOTa and SOTb may be provided to have a long axis parallel to the second direction D2. The first SOT pattern SOTa may be provided to cross the first reading and writing word lines RWL0 and WWL0. The second SOT pattern SOTb may be provided to cross the second reading and writing word lines RWL1 and WWL1. The first and second SOT patterns SOTa and SOTb may be overlapped with the second active patterns F2a and F2b, when viewed in a plan view. The first and second SOT patterns SOTa and SOTb may be disposed to have a point symmetry about the first symmetry point P1, when viewed in a plan view.

The first SOT pattern SOTa may be connected to the first connection contact plug 141a and the first MTJ pattern MTJa. The second SOT pattern SOTb may be connected to the first connection contact plug 141b and the second MTJ pattern MTJb. In other words, the first SOT pattern SOTa may be in contact with a top surface of the first connection contact plug 141a and a top surface of the first MTJ pattern MTJa. The second SOT pattern SOTb may be in contact with a top surface of the first connection contact plug 141b and a top surface of the second MTJ pattern MTJb.

A fifth interlayer insulating layer 150 may be disposed on the fourth interlayer insulating layer 140. The fifth interlayer insulating layer 150 may cover the first and second SOT patterns SOTa and SOTb. The fifth interlayer insulating layer 150 may be formed of or include at least one of oxide materials (e.g., silicon oxide), nitride materials (e.g., silicon nitride), and/or oxynitride materials (e.g., silicon oxynitride).

A second connection contact plug 151a/151b may be provided to penetrate the third interlayer insulating layers 130 and to be coupled to each of the first and second SOT patterns SOTa and SOTb.

The source line SL may be disposed on the fifth interlayer insulating layer 150. The source line SL may be overlapped with the second active patterns F2a and F2b of the first and second cell regions MC1 and MC2 and may be extended in the second direction D2. The source line SL may include a connection portion extending in the first direction D1.

The source line SL may be coupled to the second connection contact plug 151a/151b. The source line SL may be electrically connected in common to the first and second SOT patterns SOTa and SOTb through the second connection contact plug 151a/151b. The source line SL may be overlapped with the first active patterns F1a and F1b of the first and second cell regions MC1 and MC2.

A sixth interlayer insulating layer 160 may be provided on the fifth interlayer insulating layer 150 to cover the source line SL.

The bit line BL may be disposed on the sixth interlayer insulating layer 160. When viewed in a plan view, the bit line BL may cross the source line SL and may be extended in the second direction D2. The bit line BL may be overlapped with the first active patterns F1a and F1b of the first and second cell regions MC1 and MC2. A portion of the bit line BL may be overlapped with a portion of the source line SL.

The bit line BL may be connected to the second source/drain patterns SD2 of the first and second cell regions MC1 and MC2 through a third connection contact plug 161, the second conductive pattern 133, the second lower plug 123a/123b, and the second active contact pattern 113a/113b.

Figure 6:
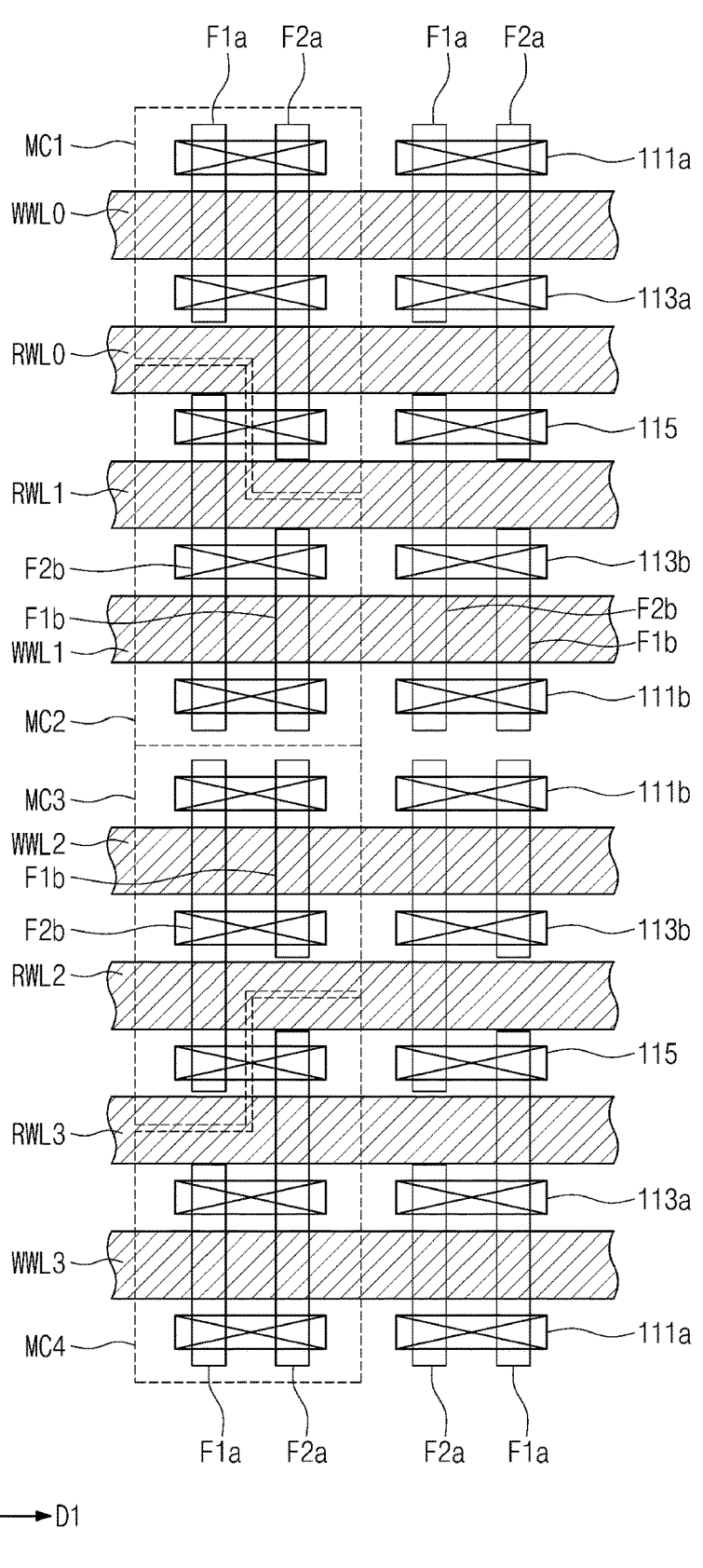
FIGS. 6, 7, and 8 are plan views, each of which illustrates a cell array of a semiconductor memory device according to some embodiments of the inventive concept.
Figure 7:
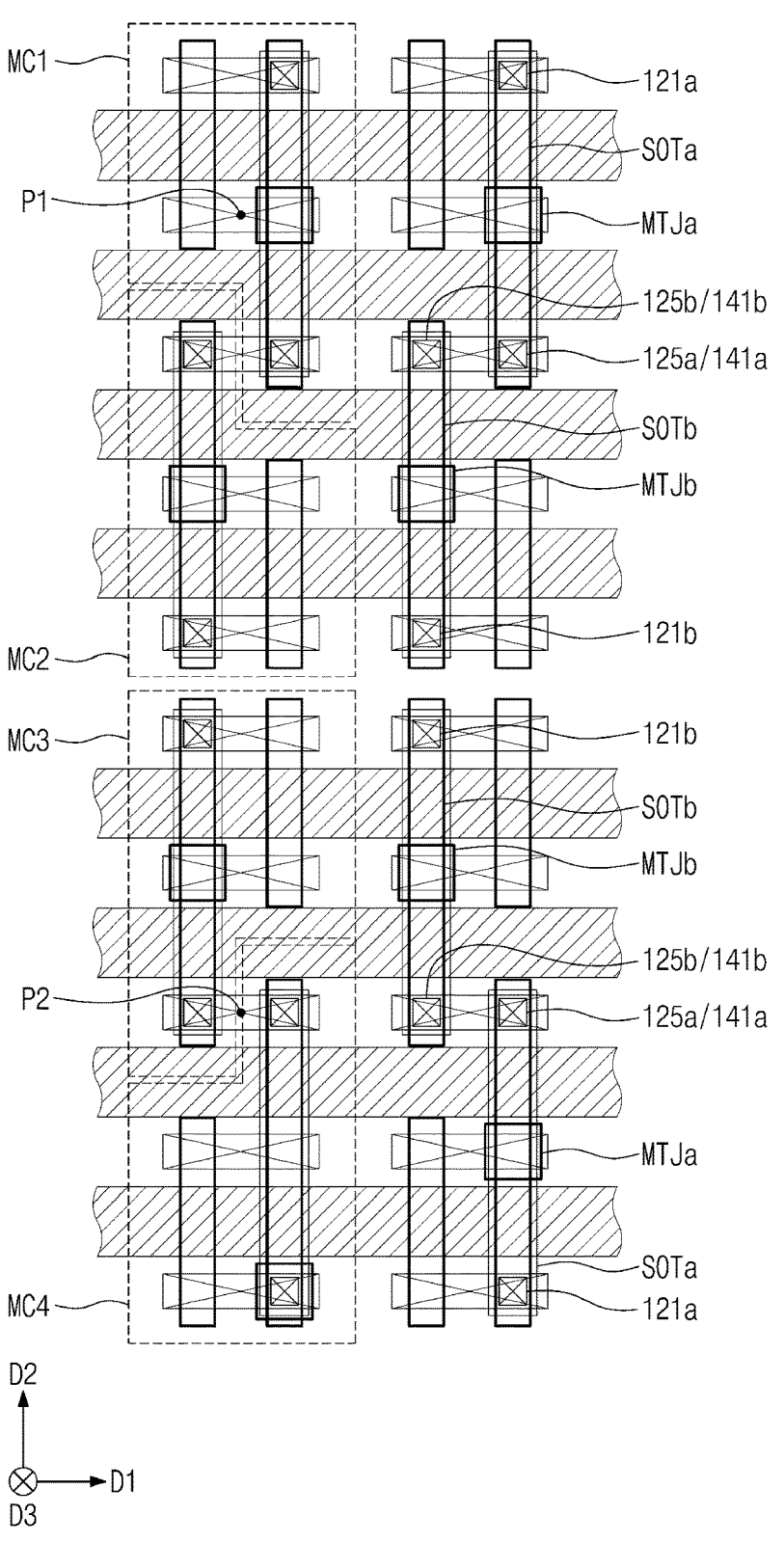
Figure 8:
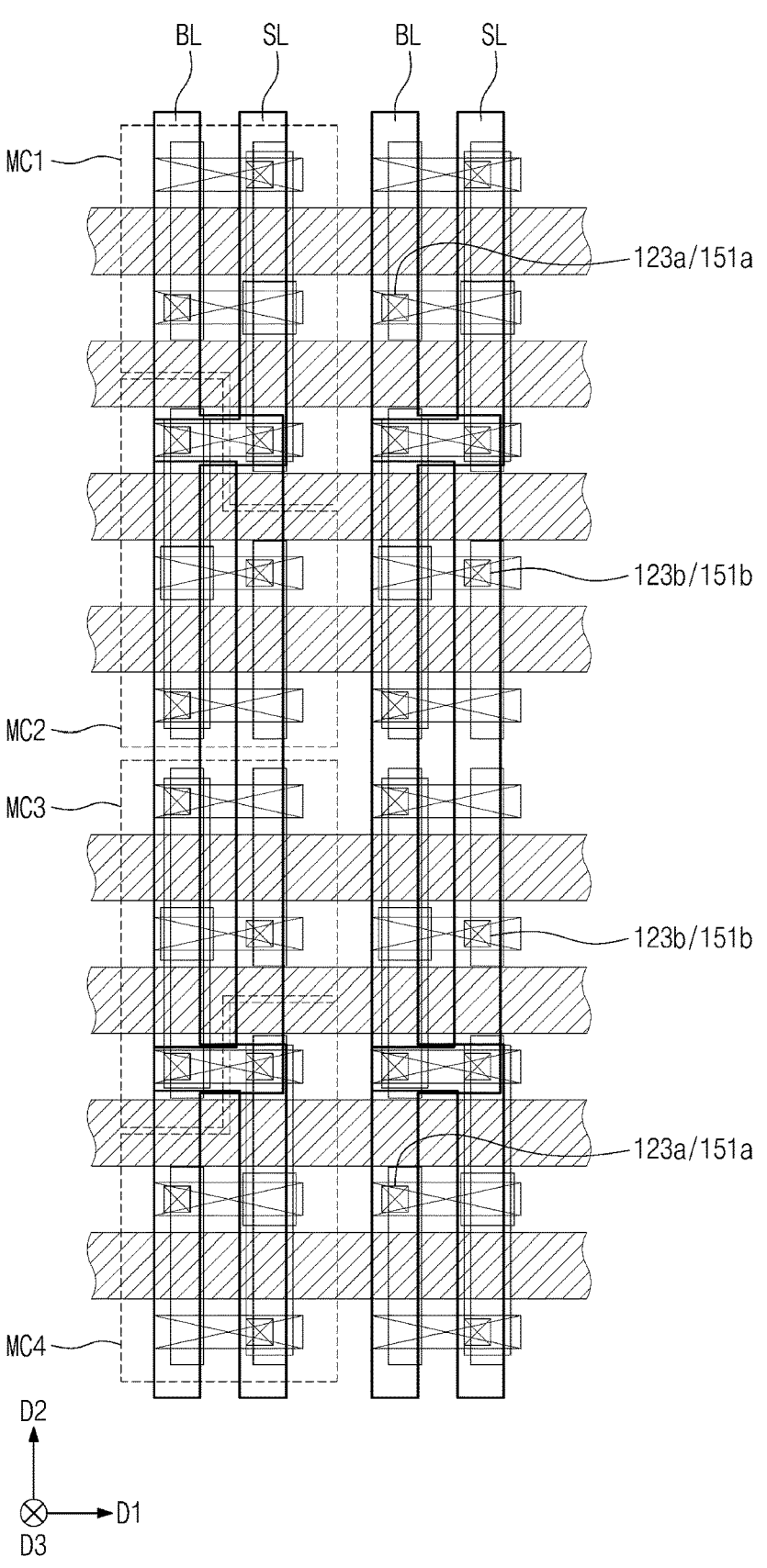

FIGS. 6, 7, and 8 are plan views, each of which illustrates a cell array of a semiconductor memory device according to some embodiments of the inventive concept. For concise description, a previously-described element may be identified by a similar or identical reference number without repeating an overlapping description thereof.

Referring to FIG. 6, the semiconductor substrate 100 may include first cell regions MC1, second cell regions MC2, third cell regions MC3, and fourth cell regions MC4.

The first to fourth cell regions MC1, MC2, MC3, and MC4 may be sequentially arranged in the second direction D2. Each of the first to fourth cell regions MC1, MC2, MC3, and MC4 may include a first active pattern (e.g., F1a/F1b of FIG. 6), which has a first length in the second direction D2, and a second active pattern (e.g., F2a/F2b of FIG. 6), which has a second length larger than the first length, as described above.

As described above, the first and second active patterns F1b and F2b of the second cell region MC2 and the first and second active patterns F1a and F2a of the first cell region MC1 may be arranged to have a point symmetry about the first symmetry point P1, when viewed in a plan view.

The third and fourth cell regions MC3 and MC4 and the first and second cell regions MC1 and MC2 may be provided to have a plane symmetry about an imaginary line parallel to the first direction D1. For example, the first and second active patterns F1b and F2b of the third cell region MC3 and the first and second active patterns F1b and F2b of the second cell region MC2 may have a mirror symmetry. The first and second active patterns F1a and F2a of the fourth cell region MC4 and the first and second active patterns F1b and F2b of the third cell region MC3 may be arranged to have a point symmetry about a second symmetry point P2, when viewed in a plan view. The first and second active patterns F1a and F2a of the fourth cell region MC4 and the first and second active patterns F1a and F2a of the first cell region MC1 may have a mirror symmetry.

The first writing and reading word lines WWL0 and RWL0 may be provided on the first cell regions MC1 arranged in the first direction D1, and the second writing and reading word lines WWL1 and RWL1 may be provided on the second cell regions MC2 arranged in the first direction D1.

The third writing and reading word lines WWL2 and RWL2 may be provided on the third cell regions MC3 arranged in the first direction D1, and fourth writing and reading word lines WWL3 and RWL3 may be provided on the fourth cell regions MC4 arranged in the first direction D1.

As described above, the first, second, and third source/drain patterns SD1, SD2, and SD3 may be provided in the first and second cell regions MC1 and MC2. Similarly, the first, second, and third source/drain patterns SD1, SD2, and SD3 may be provided in the third and fourth cell regions MC3 and MC4, and here, the first, second, and third source/drain patterns SD 1, SD2, and SD3 of the third and fourth cell regions MC3 and MC4 and the first, second, and third source/drain patterns SD1, SD2, and SD3 of the first and second cell regions MC1 and MC2 may have a mirror symmetry.

In addition, as described above, the first, second, and third active contact patterns 111a/111b, 113a/113b, and 115 may be respectively coupled to the first, second, and third source/drain patterns SD 1, SD2, and SD3. Here, the first, second, and third active contact patterns 111a/111b, 113a/113b, and 115 of the first and second cell regions MC1 and MC2 and the first, second, and third active contact patterns 111a/111b, 113a/113b, and 115 of the third and fourth cell regions MC3 and MC4 may have a mirror symmetry.

Referring to FIGS. 6 and 7, as described above, the first and second MTJ patterns MTJa and MTJb may be provided in the first and second cell regions MC1 and MC2, respectively. Similarly, the first and second MTJ patterns MTJa and MTJb may be provided in the third and fourth cell regions MC3 and MC4, respectively. The first and second MTJ patterns MTJa and MTJb of the third and fourth cell regions MC3 and MC4 and the first and second MTJ patterns MTJa and MTJb of the first and second cell regions MC1 and MC2 may have a mirror symmetry.

As described above, the first and second SOT patterns SOTa and SOTb may be provided in the first and second cell regions MC1 and MC2, respectively, and the first and second SOT patterns SOTa and SOTb may be provided in the third and fourth cell regions MC3 and MC4. Here, the first and second SOT patterns SOTa and SOTb of the third and fourth cell regions MC3 and MC4 and the first and second SOT patterns SOTa and SOTb of the first and second cell regions MC1 and MC2 may have a mirror symmetry, when viewed in a plan view.

Referring to FIGS. 6, 7, and 8, the bit line BL may be extended in the second direction D2 and may be overlapped with the second active patterns F2a and F2b of the first to fourth cell regions MC1 to MC4.

Figure 5A:
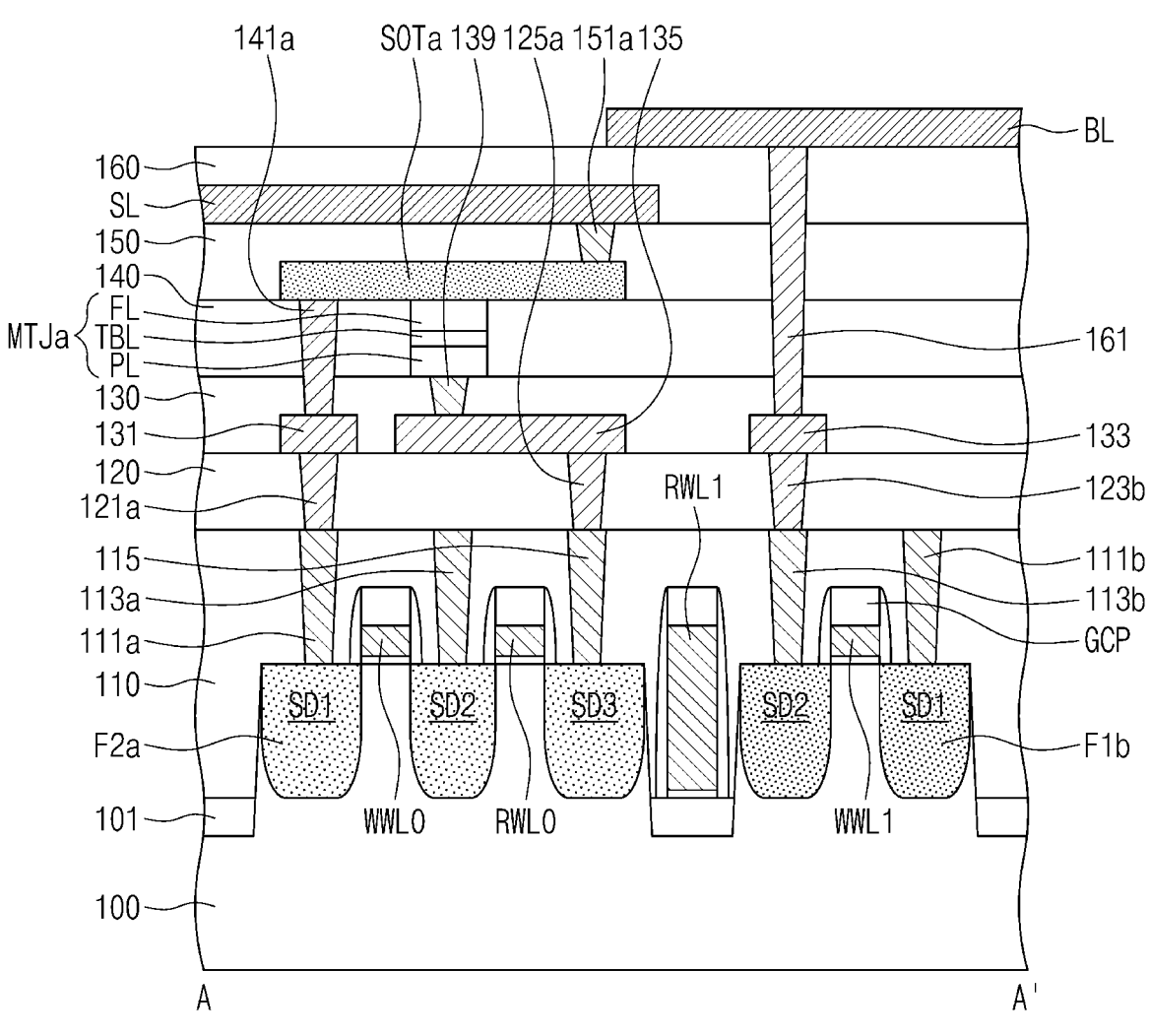
FIGS. 5A, 5B, 5C, and 5D are sectional views, which are respectively taken along lines A-A', B-B', C-C', and D-D' of FIG. 4 to illustrate a semiconductor memory device according to some embodiments of the inventive concept.
Figure 5B:
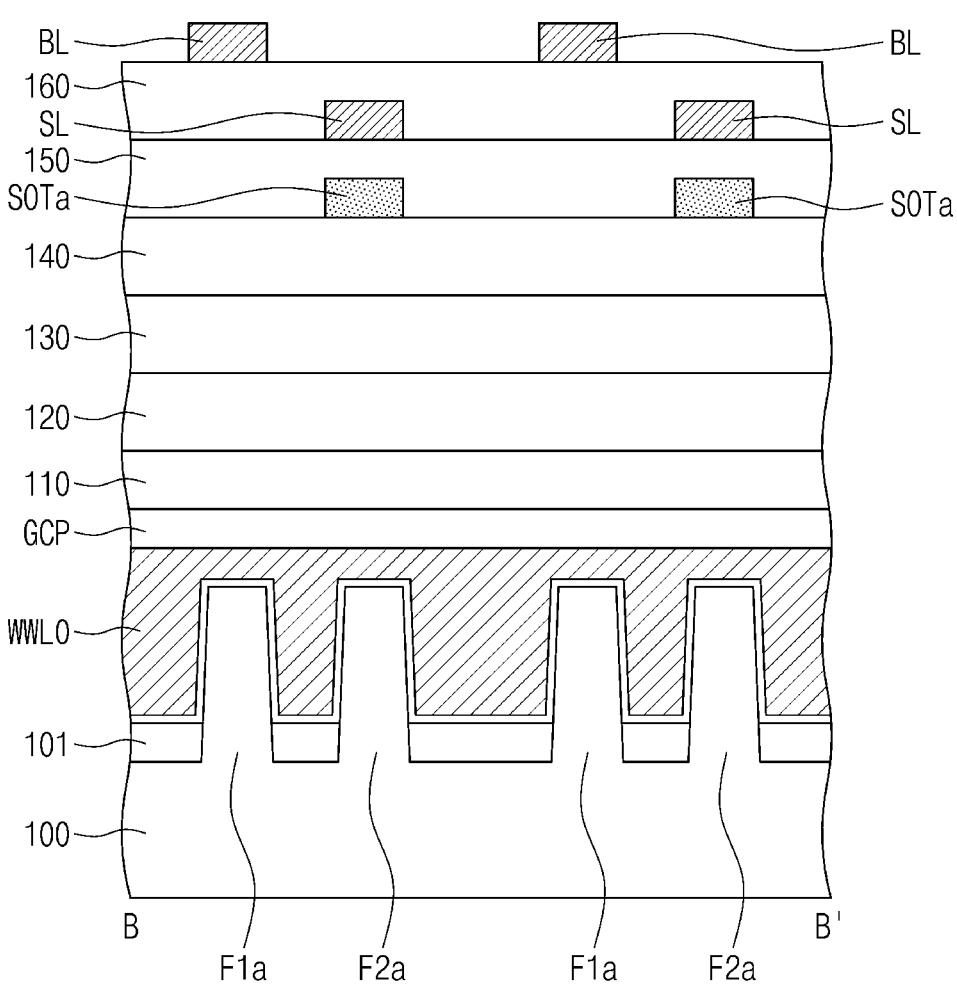
Figure 5C:
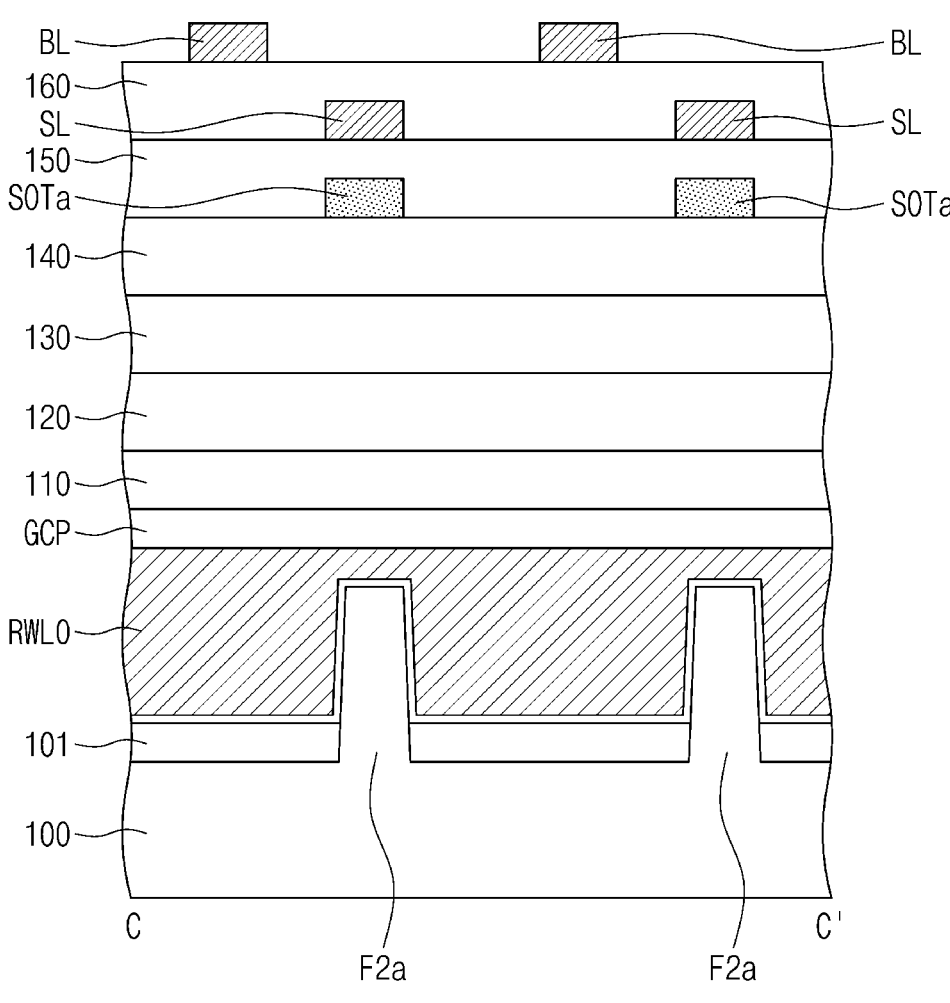

The bit line BL may be connected to the second source/drain patterns SD2 of the first to fourth cell regions MC1 to MC4 through the third connection contact plug 161, the second conductive pattern 133 of FIG. 5A, the second lower plug 123a/123b of FIG. 5A, and the second active contact pattern 113a/113b of FIG. 5A.

The source line SL may be extended in the second direction D2 to cross the bit line BL, when viewed in a plan view. The source line SL may be overlapped with the second active patterns F2a and F2b of the first to fourth cell regions MC1-MC4.

Figure 5D:
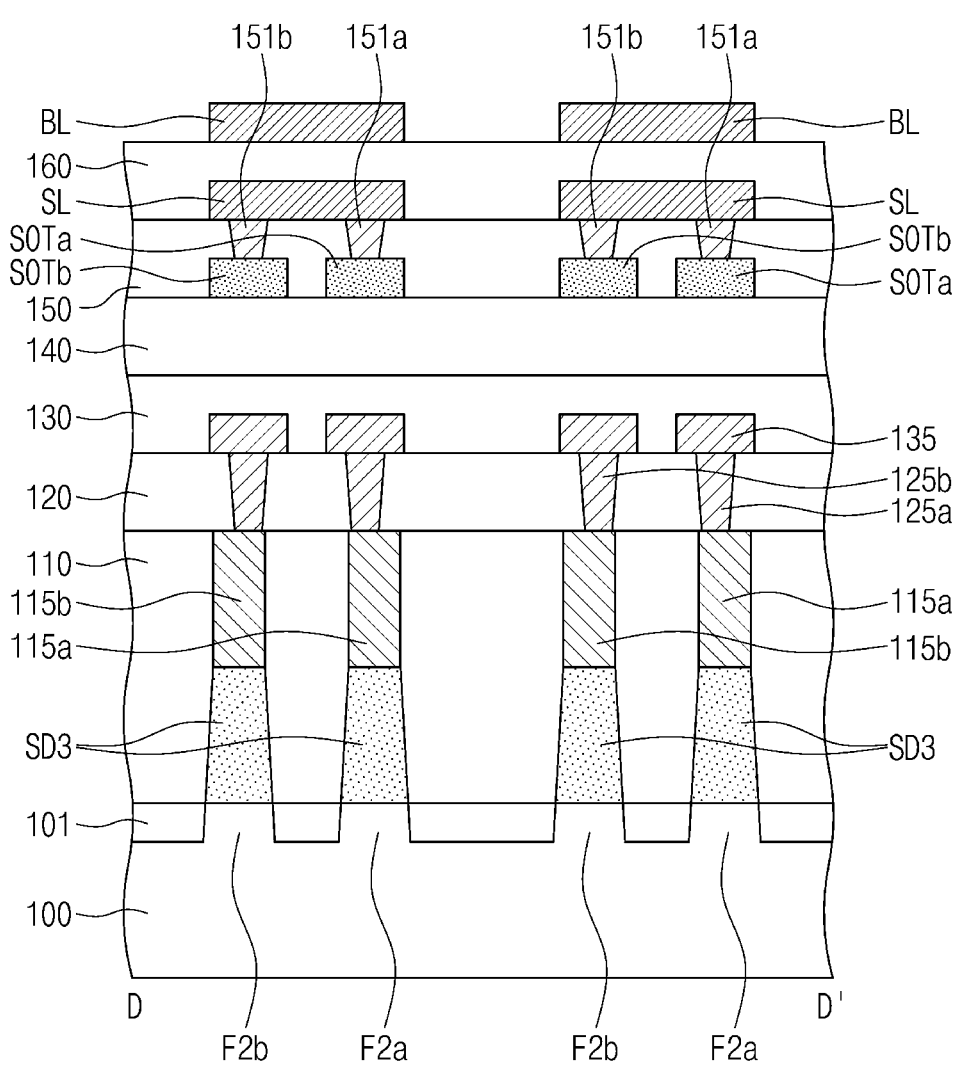

The source line SL may be electrically connected in common to the first and second SOT patterns SOTa and SOTb of the first to fourth cell regions MC1 to MC4 through the second connection contact plugs 151a and 151b of FIGS. 5A and 5D.

Figure 9:
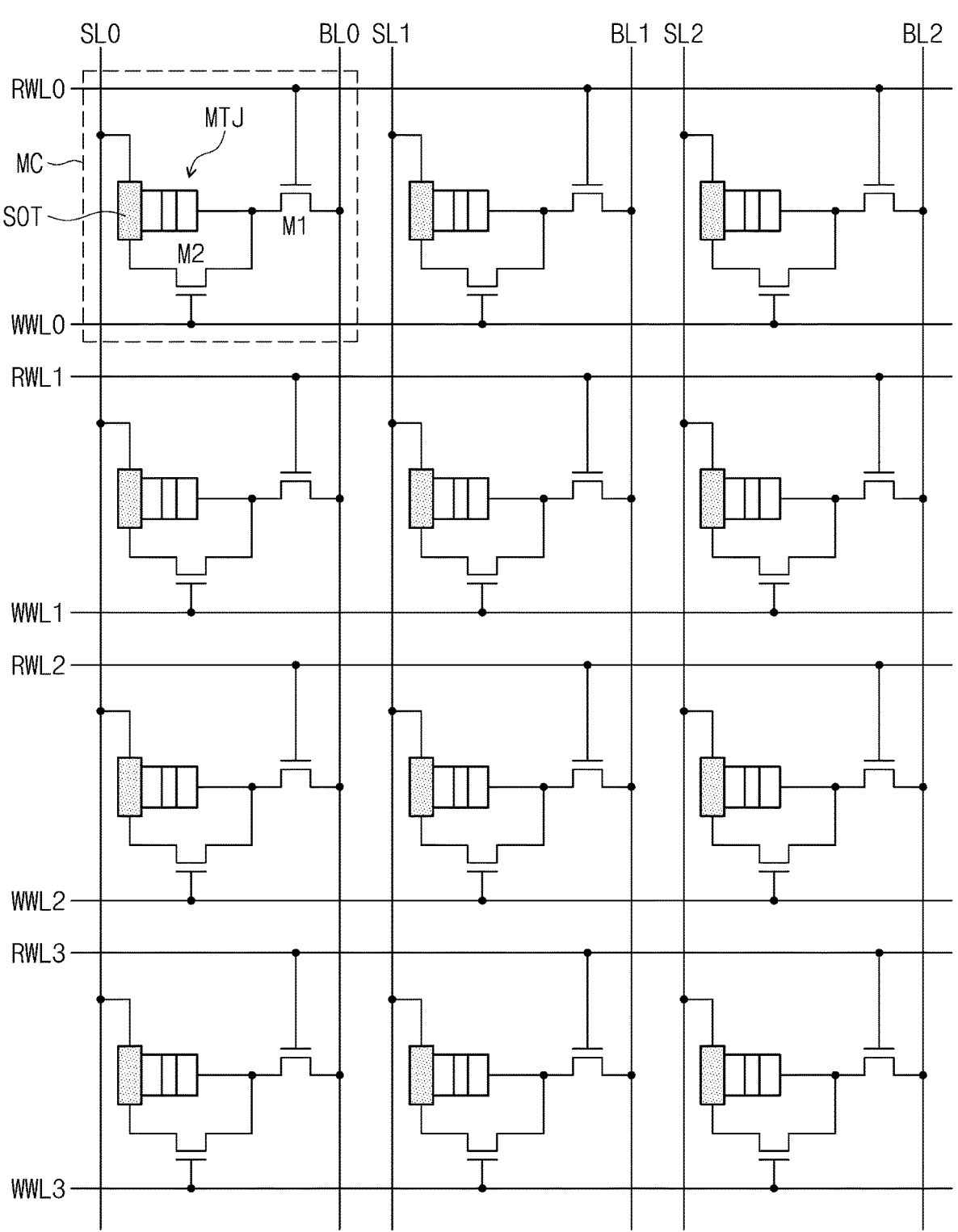
FIG. 9 is a circuit diagram illustrating a cell array of a semiconductor memory device according to some embodiments of the inventive concept.

FIG. 9 is a circuit diagram illustrating a cell array of a semiconductor memory device according to some embodiments of the inventive concept.

Referring to FIG. 9, the cell array may include a plurality of writing word lines WWL0, WWL1, WWL2, and WWL3, a plurality of reading word lines RWL0, RWL1, RWL2, and RWL3, a plurality of bit lines BL0, BL1, and BL2, a plurality of source lines SL0, SL1, and SL2, and a plurality of memory cells MC.

The memory cells MC may be arranged to form a plurality of rows and a plurality of columns. The memory cells MC of each row may be connected to a pair of reading and writing word lines RWL0-3 and WWL0-3. The memory cells MC of each column may be connected to a pair of source and bit lines SL and BL.

Each of the memory cells MC may include the MTJ pattern MTJ, the SOT pattern SOT, and the first and second transistors M1 and M2.

The SOT pattern SOT may have a first end and a second end which are opposite to each other. The first end of the SOT pattern SOT may be connected to the source line SL, and the second end of the SOT pattern SOT may be connected to the first source/drain electrode of the second transistor M2. A portion of the SOT pattern SOT may be in contact with the free magnetic pattern FL of the MTJ pattern MTJ.

The first or reading transistor M1 of the memory cell MC may be provided between and connected to the MTJ pattern MTJ and the bit line BL. A gate electrode of the first transistor M1 may be connected to and controlled by a corresponding one of the reading word lines RWL0 to RWL3.

The second or writing transistor M2 of the memory cell MC may be provided between and connected to the MTJ pattern MTJ and the second end of the SOT pattern SOT. A gate electrode of the second transistor M2 may be connected to and controlled by a corresponding one of the writing word lines WWL0 to WWL3.

The reading transistors M1 of the memory cells MC of each row may be connected in common to a corresponding one of the reading word lines RWL0-RWL3, and the second transistors M2 of the memory cells MC of each row may be connected in common to a corresponding one of the writing word lines WL0-3.

The SOT patterns SOT of the memory cells MC of each column may be connected in common to a corresponding one of the source lines SL, and the first transistors M1 of the memory cells MC of each column may be connected in common to a corresponding one of the bit lines BL.

Figure 10:
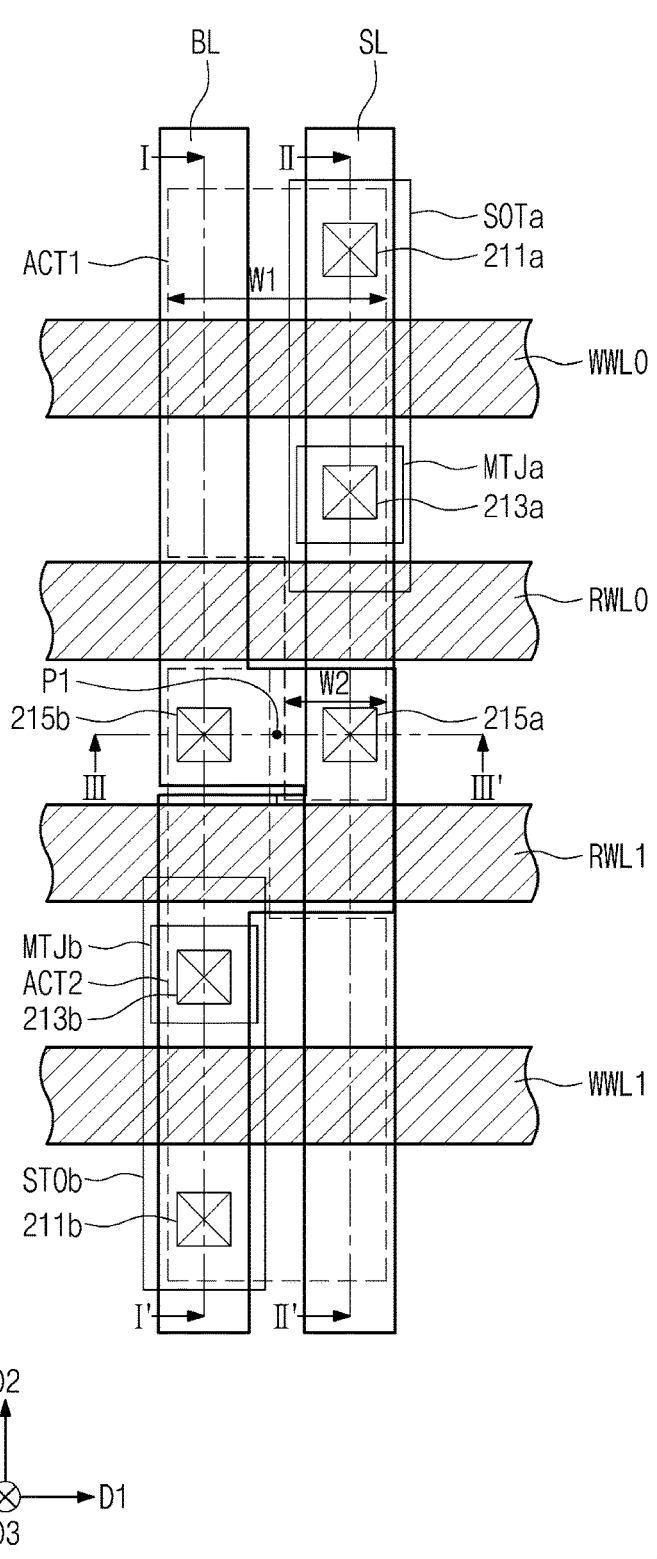
FIG. 10 is a plan view illustrating a cell array of a semiconductor memory device according to some embodiments of the inventive concept.
Figure 11A:
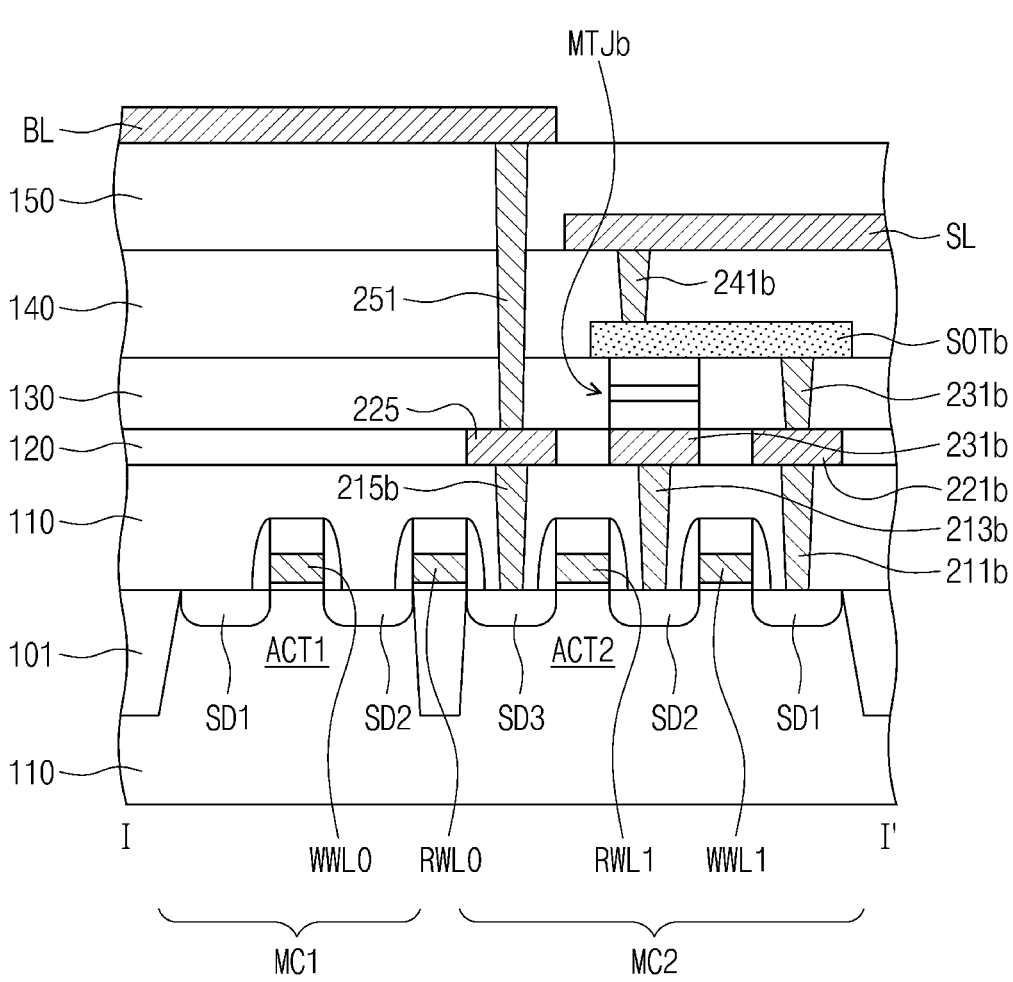
FIGS. 11A, 11B, and 11C are sectional views, which are respectively taken along lines I-I', II-II', and III-III' of FIG. 10 to illustrate a semiconductor memory device according to some embodiments of the inventive concept.
Figure 11B:
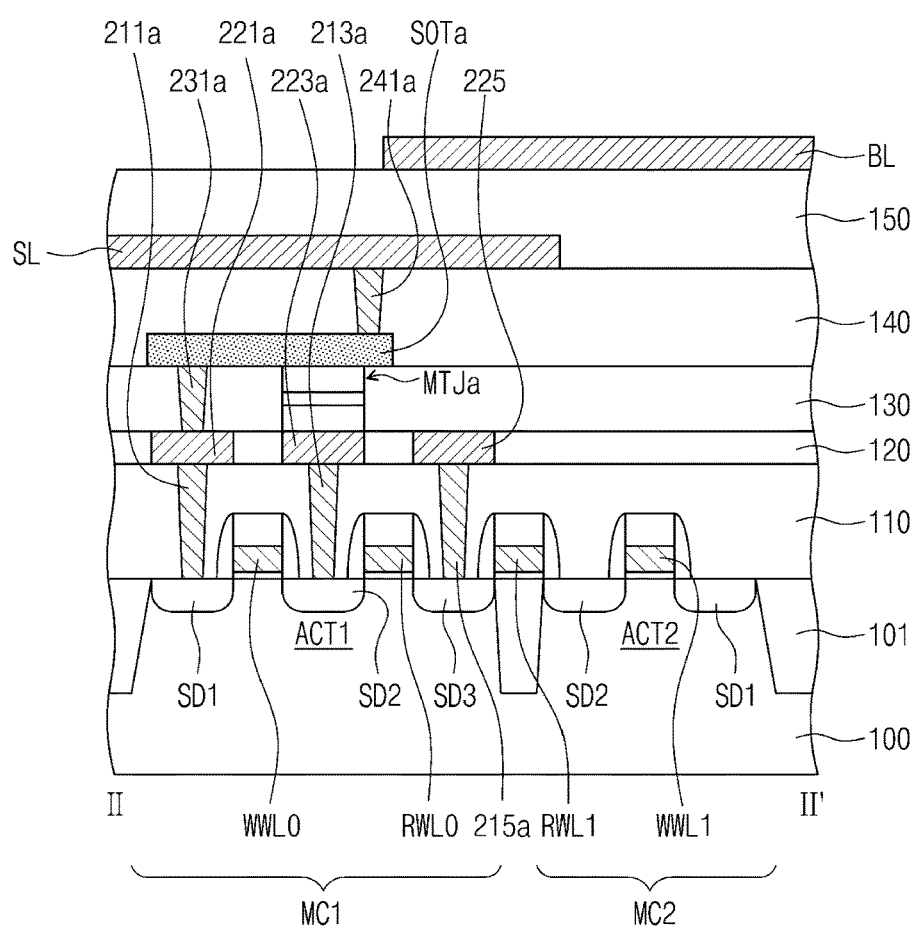
Figure 11C:
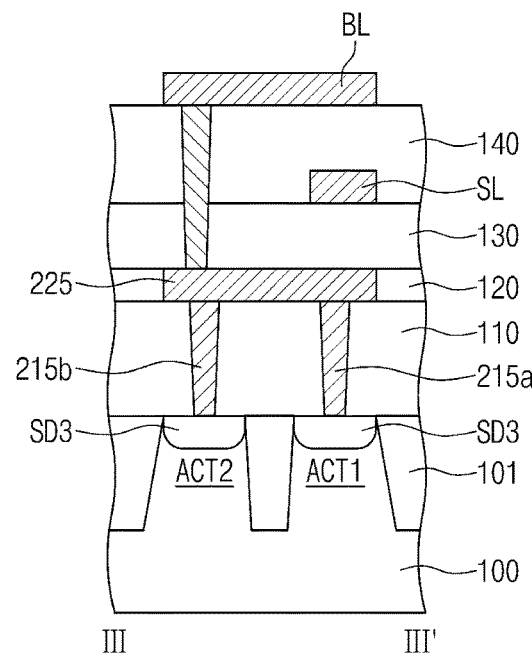

FIG. 10 is a plan view illustrating a cell array of a semiconductor memory device according to some embodiments of the inventive concept. FIGS. 11A, 11B, and 11C are sectional views, which are respectively taken along lines I-I', II-II', III-III' and of FIG. 10 to illustrate a semiconductor memory device according to some embodiments of the inventive concept.

Referring to FIGS. 10, 11A, 11B, and 11C, the device isolation pattern 101 may be disposed in the semiconductor substrate 100 to define first and second active regions ACT1 and ACT2.

In some embodiments, the first and second active regions ACT1 and ACT2 may be disposed in the second direction D2. Each of the first and second active regions ACT1 and ACT2 may include a first portion and a second portion, which are respectively provided to have a first width W1 and a second width W2 smaller than the first width W1, when measured in the first direction D1. Here, the first and second active regions ACT1 and ACT2 may be disposed to have a point symmetry about the first symmetry point P1, when viewed in a plan view.

The first and second writing word lines WWL0 and WWL1 and the first and second reading word lines RWL0 and RWL1 may be disposed on the semiconductor substrate 100. The first and second reading word lines RWL0 and RWL1 may be disposed between the first and second writing word lines WWL0 and WWL1.

The first and second writing word lines WWL0 and WWL1 may be provided to cross the first portions of the first and second active regions ACT1 and ACT2, and the first and second reading word lines RWL0 and RWL1 may be provided to cross the second portions of the first and second active regions ACT1 and ACT2. In other words, an overlapping area between the first writing word line WWL0 and the first active region ACT1 may be larger than an overlapping area between the first reading word line RWL0 and the first active region ACT1. That is, in the memory cell MC shown in FIG. 9, an effective channel width of the second transistor M2 may be larger than an effective channel width of the first transistor M1.

The first source/drain patterns SD1 may be provided in upper portions of the first and second active regions ACT1 and ACT2, which are located at a side of the first writing word line WWL0 and at an opposite side of the second writing word line WWL1.

The second source/drain patterns SD2 may be provided in upper portions of the first and second active regions ACT1 and ACT2, which are located between the first writing word line WWL0 and the first reading word line RWL1 and between the second writing word line WWL1 and the second reading word line RWL1.

The third source/drain patterns SD3 may be provided in upper portions of the first and second active regions ACT1 and ACT2, which are located between the first and second reading word lines RWL0 and RWL1.

First, second, and third active contact patterns 211a/211b, 213a/213b, and 215a/215b may be provided to penetrate the first interlayer insulating layer 110 and may be coupled to the first, second, and third source/drain patterns SD1, SD2, and SD3, respectively. The first, second, and third active contact patterns 211a, 213a, and 215a on the first active region ACT1 and the first, second, and third active contact patterns 211b, 213b, and 215b on the second active region ACT2 may be configured to have a point symmetry about the first symmetry point P1.

The second interlayer insulating layer 120 may be disposed on the first interlayer insulating layer 110, and first to third conductive patterns 221a/221b, 223a/223b, and 225 may be disposed in the second interlayer insulating layer 120. The first conductive patterns 221a and 221b may be coupled to the first active contact patterns 211a and 211b, and the second conductive patterns 223a and 223b may be coupled to the second active contact patterns 213a and 213b.

A third conductive pattern 225 may be coupled in common to the third active contact patterns 215a and 215b.

The first and second MTJ patterns MTJa and MTJb may be disposed on the second interlayer insulating layer 120. The first and second MTJ patterns MTJa and MTJb may be disposed on the second conductive patterns 223a and 223b. The first and second MTJ patterns MTJa and MTJb may be configured to have a point symmetry about the first symmetry point P1.

The third interlayer insulating layer 130 may be disposed on the second interlayer insulating layer 120. In some embodiments, the third interlayer insulating layer 130 may fill a space between the first and second MTJ patterns MTJa and MTJb.

The first and second SOT patterns SOTa and SOTb may be disposed on the third interlayer insulating layer 130. The first and second SOT patterns SOTa and SOTb may be disposed to have a point symmetry about the first symmetry point P1.

A first and second lower contact plug 231a/231b may be provided to penetrate the third interlayer insulating layer 130 and may be coupled to the first conductive pattern 221a/221b. The first and second lower contact plug 231a/231b may connect the first or second SOT pattern SOTa or SOTb to the first conductive pattern 221a/221b.

The first and second SOT patterns SOTa and SOTb may be connected to the first and second MTJ patterns MTJa and MTJb, respectively. The first and second SOT patterns SOTa and SOTb may be adjacent to or in contact with the free magnetic patterns FL of the first and second MTJ patterns MTJa and MTJb. Each of the first and second SOT patterns SOTa and SOTb may be provided to have a long axis parallel to the second direction D2.

The first SOT pattern SOTa may be connected to the first lower contact plug 231a and the first MTJ pattern MTJa. The second SOT pattern SOTb may be connected to the second lower contact plug 231b and the second MTJ pattern MTJb. In other words, the first SOT pattern SOTa may be in contact with a top surface of the first lower contact plug 231a and a top surface of the first MTJ pattern MTJa. The second SOT pattern SOTb may be in contact with a top surface of the second lower contact plug 231b and a top surface of the second MTJ pattern MTJb.

The fourth interlayer insulating layer 140 may be disposed on the third interlayer insulating layer 130. The fourth interlayer insulating layer 140 may cover or overlap the first and second SOT patterns SOTa and SOTb.

First and second upper plugs 241a and 241b may be provided to penetrate the fourth interlayer insulating layer 140 and may be coupled to the first and second SOT patterns SOTa and SOTb, respectively.

The source line SL may be disposed on the fourth interlayer insulating layer 140 and may be extended in the second direction D2. The source line SL may be coupled in common to the first and second upper plugs 241a and 241b. The source line SL may be electrically connected in common to the first and second SOT patterns SOTa and SOTb through the first and second upper plugs 241a and 241b. In some embodiments, the source line SL may be overlapped with the first and second SOT patterns SOTa and SOTb and may be extended in the second direction D2.

The fifth interlayer insulating layer 150 may be disposed on the fourth interlayer insulating layer 140. The bit line BL may be disposed on the fifth interlayer insulating layer 150. The bit line BL may be extended in the second direction D2 but may not be overlapped with the first and second SOT patterns SOTa and SOTb. The bit line BL may be provided to cross a portion of the source line SL. The bit line BL may be connected to the third conductive pattern 225 through a bit line contact plug 251.

Figure 12:
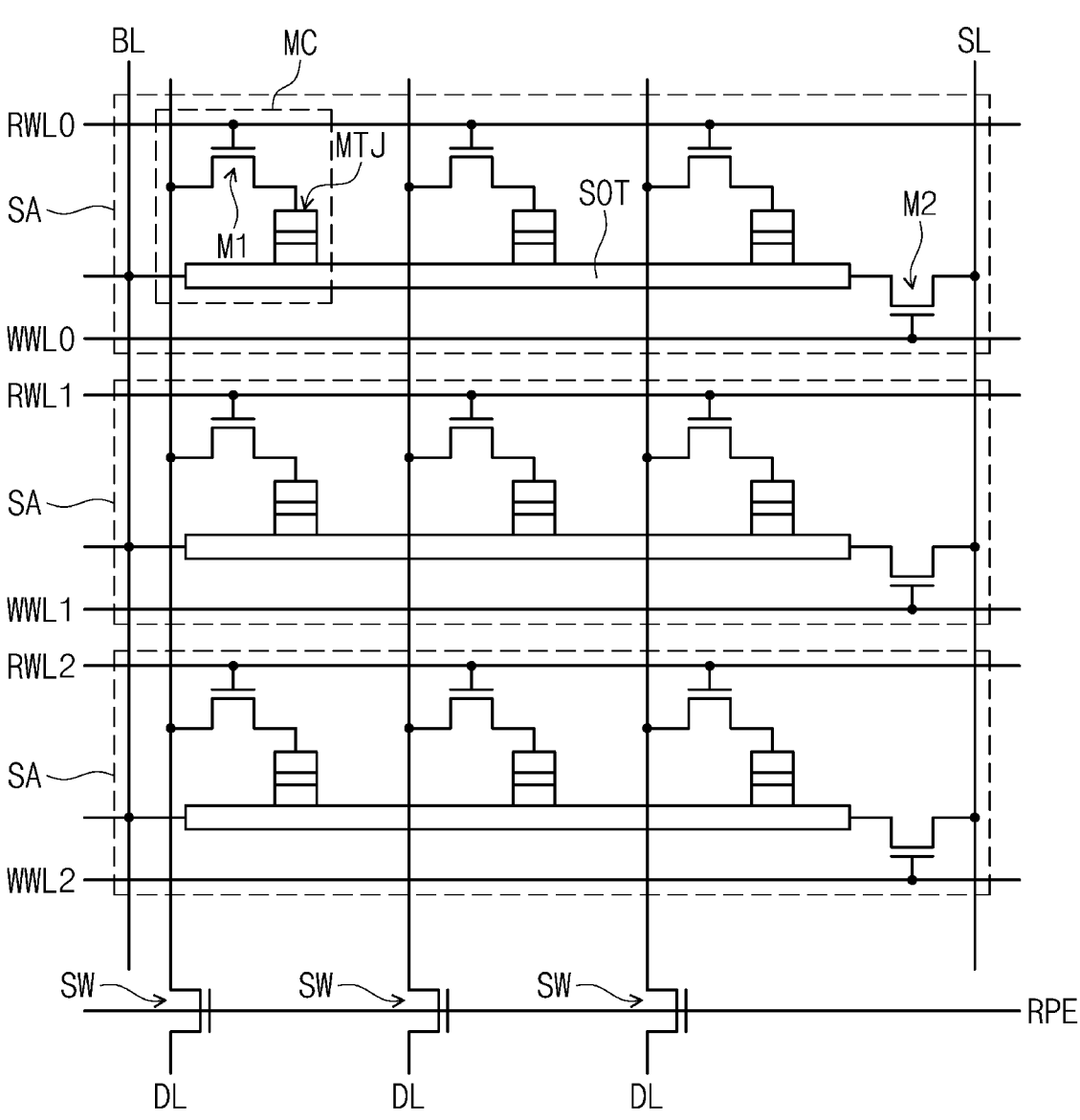
FIG. 12 is a circuit diagram illustrating a cell array of a semiconductor memory device according to some embodiments of the inventive concept.
Figure 13:
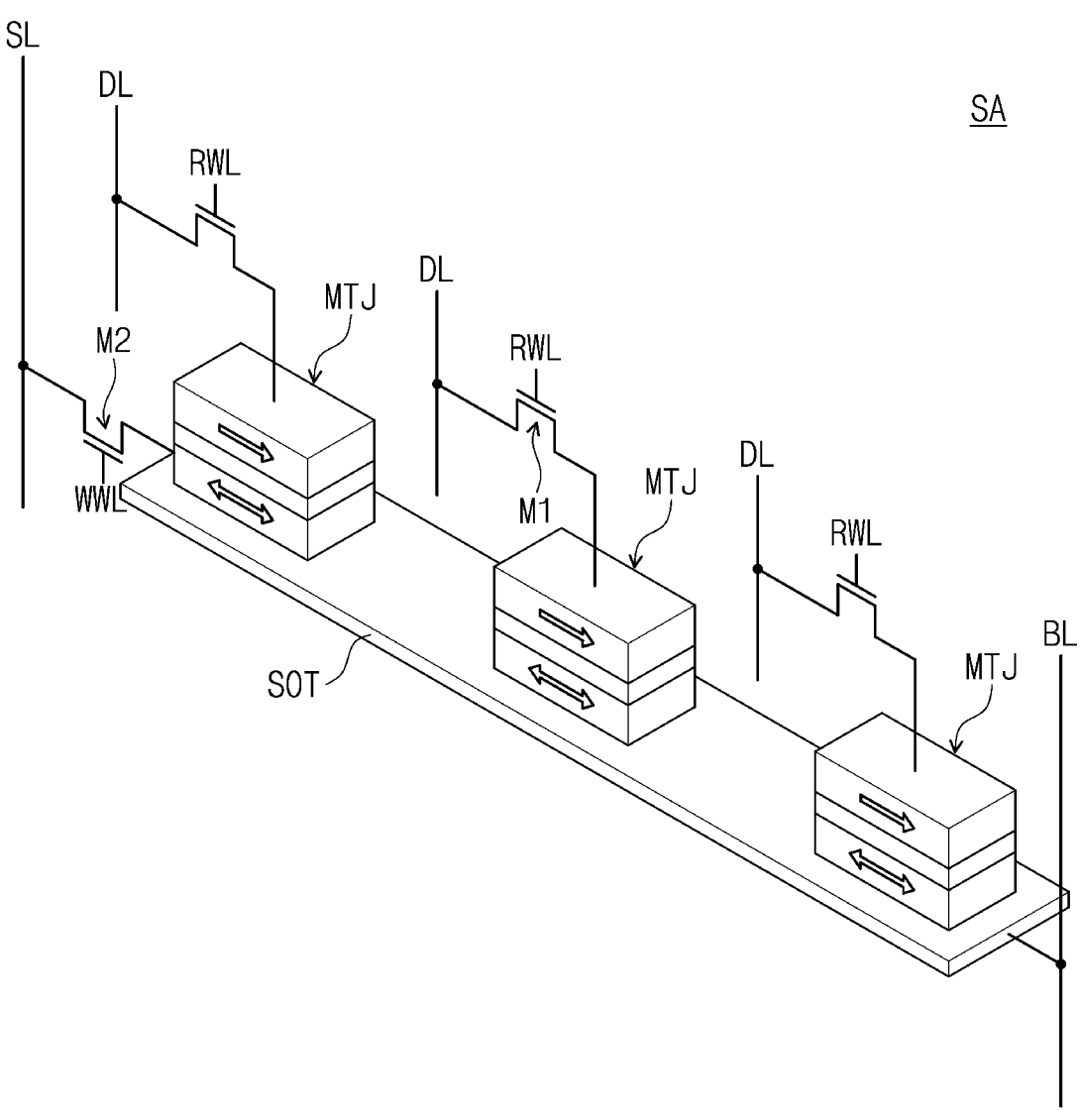
FIG. 13 is a diagram illustrating a single sub-array in a cell array of a semiconductor memory device according to some embodiments of the inventive concept.

FIG. 12 is a circuit diagram illustrating a cell array of a semiconductor memory device according to some embodiments of the inventive concept. FIG. 13 is a diagram illustrating a single sub-array in a cell array of a semiconductor memory device according to some embodiments of the inventive concept.

Referring to FIGS. 12 and 13, the memory cell array may include a plurality of sub-arrays SA. The sub-arrays SA may be provided between and connected to a pair of the bit and source lines BL and SL.

Each of the sub-arrays SA may be connected to one write word line WWL and one read word line RWL. Each of the sub-arrays SA may include the memory cells MC arranged in the row direction, the SOT pattern SOT connected in common to the memory cells MC, and one second transistor M2. Each sub-array SA may include a plurality of memory cells. As an example, each sub-array SA may include three memory cells, as shown in FIG. 13. Each of the memory cells MC may include a data storage device (e.g., the MTJ pattern MTJ) and the first transistor M1.

In some embodiments, the MTJ patterns MTJ in each sub-array SA may share one SOT pattern SOT. Thus, each of the memory cells MC may require or need a device that is configured to allow for a dynamic program of changing a direction of spin accumulation (e.g., SOT polarity) in each memory cell MC during a data writing operation. That is, there is a need for an additional element capable of selectively programming the memory cells MC of each sub-array SA during supplying a current to the SOT pattern SOT in a specific direction. Thus, each MTJ patterns MTJ may include an oxygen storage layer, and in this case, by using an oxygen migration, which is caused by a voltage or electric field applied to the oxygen storage layer, and a modulation of polarity of a spin-orbit torque (SOT), it may be possible to realize a data programming operation.

The second transistor M2 may include gate, source, and drain electrodes, which are connected to the writing word line WWL, the source line SL, and the SOT pattern SOT, respectively.

The first transistors M1 of the memory cells MC may be connected to data lines DL, respectively. Each data line DL may be connected to a sense amplifier (not shown) through a drive transistor SW, and a sensing voltage of the data line DL may be compared with a reference voltage to determine data stored in the memory cell MC.

The first transistor M1 may include gate, drain, and source electrodes, which are connected to the reading word line RWL, the data line DL, and the MTJ pattern MTJ, respectively.

In some embodiments, each of the first transistors M1 in each sub-array SA may have a size different from the second transistor M2. For example, similar to the aforementioned embodiments, an effective channel width of the first transistor M1 may be smaller than an effective channel width of the second transistor M2. As an example, an overlapping area between the gate electrode of the first transistor M1 and the active region may be smaller than an overlapping area between the gate electrode of the second transistor M2 and the active region.

According to some embodiments of the inventive concept, a first or reading transistor and a second or writing transistor provided in a unit memory cell may have different effective channel widths from each other, and this may make it possible to increase an integration density of a semiconductor memory device.

Furthermore, a channel width of a second transistor, which is connected to a spin-orbit torque pattern, may be larger than a channel width of a first transistor, and in this case, it may be possible to reduce a writing energy required for a writing operation on a semiconductor memory device.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor memory device, comprising:
a semiconductor substrate including an active region defined by a device isolation pattern;
a magnetic tunnel junction pattern;
a spin-orbit torque (SOT) pattern in contact with a first portion of the magnetic tunnel junction pattern;
a first transistor on the active region of the semiconductor substrate, the first transistor electrically connected to a second portion of the magnetic tunnel junction pattern and configured to be controlled by a first word line; and
a second transistor on the active region of the semiconductor substrate, the second transistor contacts a first end of the spin-orbit torque pattern and configured to be controlled by a second word line,
wherein an effective channel width of the first transistor is different from an effective channel width of the second transistor,
wherein the active region comprises a first portion having a first width and a second portion having a second width larger than the first width,
wherein the first word line crosses the first portion of the active region, and
wherein the second word line crosses the second portion of the active region.

2. The semiconductor memory device of claim 1, further comprising:
a semiconductor substrate comprising a first active pattern with a first length and a second active pattern with a second length that is less than the first length,
wherein the first word line crosses the first active pattern, and
wherein the second word line crosses the first and second active patterns.

3. The semiconductor memory device of claim 1, further comprising:
a bit line that crosses the first and second word lines and is electrically connected to first source/drain terminals of the first and second transistors; and
a source line that crosses the first and second word lines and contacts a second end of the spin-orbit torque pattern.

4. The semiconductor memory device of claim 1, wherein the first transistor is physically connected to the second portion of the magnetic tunnel junction pattern.

5. A semiconductor memory device, comprising:
a semiconductor substrate;
a bit line and a source line that both extend in a second direction that is perpendicular to a first direction; and
a plurality of memory cells on the semiconductor substrate,
wherein each of the plurality of memory cells comprises:
a first word line and a second word line that both extend in the first direction;

an active region defined by a device isolation pattern in the semiconductor substrate;
a spin-orbit torque (SOT) pattern having a first end electrically connected to the source line, and having a second end that is opposite to the first end;
a magnetic tunnel junction pattern on the SOT pattern;
a first transistor electrically connected to a first end of the magnetic tunnel junction pattern, wherein the first transistor is between the first end of the magnetic tunnel junction pattern and the bit line and configured to be controlled by the first word line; and
a second transistor that contacts the second end of the SOT pattern, wherein the second transistor is between the second end of the SOT pattern and the bit line and is configured to be controlled by the second word line,
wherein the first word line and the second word line cross the active region of a semiconductor substrate, and
wherein an overlapping area between the first word line and the active region is smaller than an overlapping area between the second word line and the active region.

6. The semiconductor memory device of claim 5,
wherein the active region comprises a first active pattern, which has a first length, and a second active pattern, which has a second length that is less than the first length,
wherein the first word line crosses the first active pattern, and
wherein the second word line crosses the first and second active patterns.

7. The semiconductor memory device of claim 6,
wherein the memory cells comprise a first memory cell and a second memory cell, which are adjacent to each other in the second direction, and
wherein at least a portion of the first memory cell and at least a portion of the second memory cell have point symmetry when viewed in a plan view.

8. The semiconductor memory device of claim 7, wherein the first and second active patterns of the second memory cell and the first and second active patterns of the first memory cell have point symmetry.

9. The semiconductor memory device of claim 7,
wherein the plurality of memory cells further comprises third and fourth memory cells, which are sequentially arranged in the second direction, and
wherein the third and fourth memory cells and the first and second memory cells have a plane symmetry about an imaginary line parallel to the first direction, when viewed in a plan view.

10. The semiconductor memory device of claim 7, wherein portions of the first active patterns of the first and second memory cells are between the first word lines of the first and second memory cells.

11. The semiconductor memory device of claim 7,
wherein the bit line overlaps the second active patterns of the first and second memory cells and extends in the second direction, and
wherein the source line overlaps the first active patterns of the first and second memory cells and extends in the second direction.

12. The semiconductor memory device of claim 5,
wherein the memory cells comprise a first memory cell and a second memory cell, which are adjacent to each other in the second direction, and
wherein the first word lines of the first and second memory cells are between the respective second word lines of the first and second memory cells.

13. The semiconductor memory device of claim 5, wherein the magnetic tunnel junction pattern comprises a pinned magnetic pattern, a free magnetic pattern, and a tunnel barrier pattern therebetween, and wherein the free magnetic pattern is in contact with the SOT pattern.

14. The semiconductor memory device of claim 5, wherein the magnetic tunnel junction pattern has a top surface and a bottom surface which is opposite to the top surface, wherein the bottom surface of the magnetic tunnel junction pattern is closer to the semiconductor substrate than the top surface, and wherein the SOT pattern is in contact with the top surface of the magnetic tunnel junction pattern.

15. The semiconductor memory device of claim 5, wherein the memory cells comprise first, second, third, and fourth memory cells, which are sequentially arranged in the second direction, wherein the active region comprises a first active pattern, which has a first length, and a second active pattern, which has a second length that is less than the first length, wherein the first and second active patterns of the second memory cell and the first and second active patterns of the first memory cell have point symmetry, and wherein the first and second active patterns of the third and fourth memory cells and the first and second active patterns of the first and second memory cells have a plane symmetry about an imaginary line parallel to the first direction.

16. The semiconductor memory device of claim 5, wherein the first transistor is physically connected to the first end of the magnetic tunnel junction pattern.

17. A semiconductor memory device, comprising:

a semiconductor substrate comprising a first cell region and a second cell region, each of the first and second cell regions comprising first and second active patterns which protrude from the semiconductor substrate;

a first writing word line on the first cell region, wherein the first writing word line crosses the first and second active patterns;

a second writing word line on the second cell region, wherein the second writing word line crosses the first and second active patterns;

a first reading word line on the first cell region, wherein the first reading word line is spaced apart from the first active pattern, crosses the second active pattern, and is between the first and second writing word lines;

a second reading word line on the second cell region, wherein the second reading word line is spaced apart from the first active pattern, crosses the second active pattern, and is between the first reading word line and the second writing word line;

first source/drain patterns at a side of the first writing word line and at a side of the second writing word line, respectively;

second source/drain patterns between the first reading and writing word lines and between the second reading and writing word lines;

a third source/drain pattern between the first and second reading word lines;

first and second magnetic tunnel junction patterns electrically connected to the second source/drain patterns, respectively;

first and second spin-orbit torque (SOT) patterns on the first and second magnetic tunnel junction patterns, respectively;

a source line that crosses the first and second writing word lines and the first and second reading word lines and is electrically connected to the first and second SOT patterns; and a bit line that crosses the first and second writing word lines and the first and second reading word lines and is electrically connected to the second source/drain patterns, wherein, when measured from the semiconductor substrate, the bit line is at a first height, the source line is at a second height, and the first and second SOT patterns are at a third height, and wherein the third height is less than the first height and the second height.

18. The semiconductor memory device of claim 17, wherein a first length of the first active pattern is less than a second length of the second active pattern, when measured in a first direction.

19. The semiconductor memory device of claim 18, wherein the first and second active patterns of the first cell region and the first and second active patterns of the second cell region have point symmetry.

20. The semiconductor memory device of claim 17, wherein the first and second SOT pattern-patterns are in contact with top surfaces of the first and second magnetic tunnel junction patterns, respectively.

* * * * *